US012581721B2

(12) United States Patent
Chiu et al.

(10) Patent No.: US 12,581,721 B2
(45) Date of Patent: Mar. 17, 2026

(54) METHOD FOR GAP FILLING WITH SELECTIVELY FORMED SEED LAYER AND HETEROEPITAXIAL CAP LAYER

(71) Applicant: TAIWAN SEMICONDUCTOR MANUFACTURING COMPANY, LTD., Hsinchu (TW)

(72) Inventors: Ya-Wen Chiu, Tainan City (TW); De Jhong Liao, Hsinchu (TW); Yu-Yu Chen, New Taipei City (TW); Szu-Ying Chen, Hsinchu (TW); Zheng-Yang Pan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 405 days.

(21) Appl. No.: 18/232,932

(22) Filed: Aug. 11, 2023

(65) Prior Publication Data

US 2025/0056870 A1 Feb. 13, 2025

(51) Int. Cl.
H10D 84/03 (2025.01)
H10D 64/01 (2025.01)
H10D 84/01 (2025.01)

(52) U.S. Cl.
CPC ......... H10D 84/038 (2025.01); H10D 64/017 (2025.01); H10D 84/0151 (2025.01); H10D 84/0158 (2025.01)

(58) Field of Classification Search
CPC ........... H10D 84/0151; H10D 84/0158; H10D 64/017
See application file for complete search history.

(56) References Cited

U.S. PATENT DOCUMENTS

| | | | |
|---|---|---|---|
| 8,450,191 | B2 | 5/2013 | Wang et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 10,504,747 | B2 | 12/2019 | Yu et al. |
| 10,535,751 | B2 | 1/2020 | Yu et al. |
| 10,868,140 | B2 | 12/2020 | Yu et al. |
| 11,404,320 | B2 | 8/2022 | Chang et al. |
| 11,605,555 | B2 | 3/2023 | Chen et al. |
| 2005/0037555 | A1 | 2/2005 | Chen et al. |
| 2021/0257259 | A1 | 8/2021 | Chiang et al. |
| 2022/0301823 | A1 | 9/2022 | Yoo et al. |
| 2022/0376091 | A1 | 11/2022 | Chiu et al. |
| 2025/0056870 | A1* | 2/2025 | Chiu .................. H10D 84/0151 |

FOREIGN PATENT DOCUMENTS

TW 202303769 A 1/2023

* cited by examiner

*Primary Examiner* — Mark V Prenty
(74) *Attorney, Agent, or Firm* — NZ Carr Law Office

(57) ABSTRACT

Embodiments of the present disclosure provide a method for selectively forming a seed layer over semiconductor fins. Some embodiments provide forming the selective seed layer using a mono-silane at an increased temperature. Some embodiments provide depositing a hetero-crystalline silicon cap layer over the bottom-up gap layer to improve gap filling and tune profiles of fin structures.

20 Claims, 26 Drawing Sheets

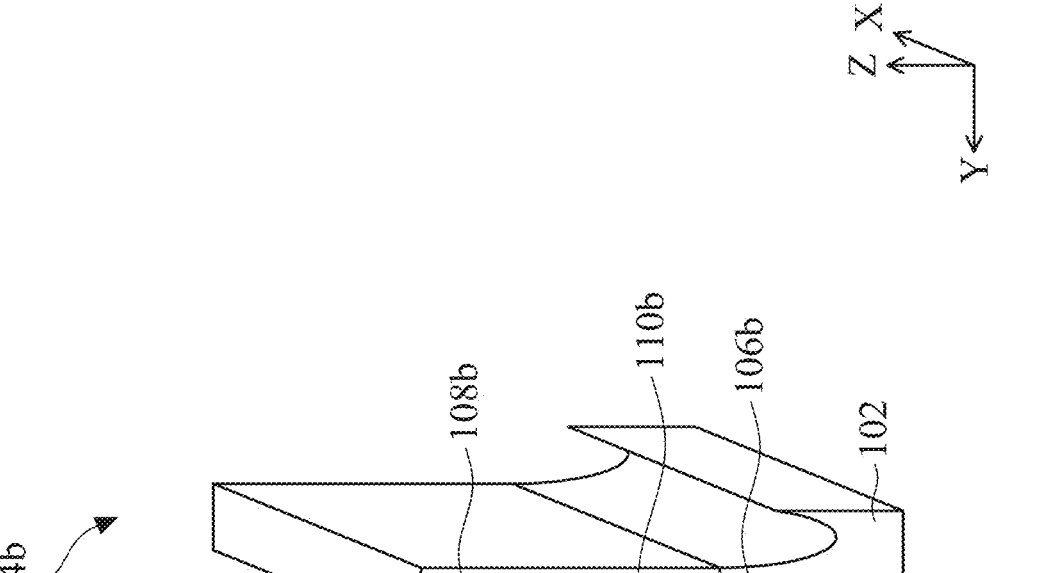
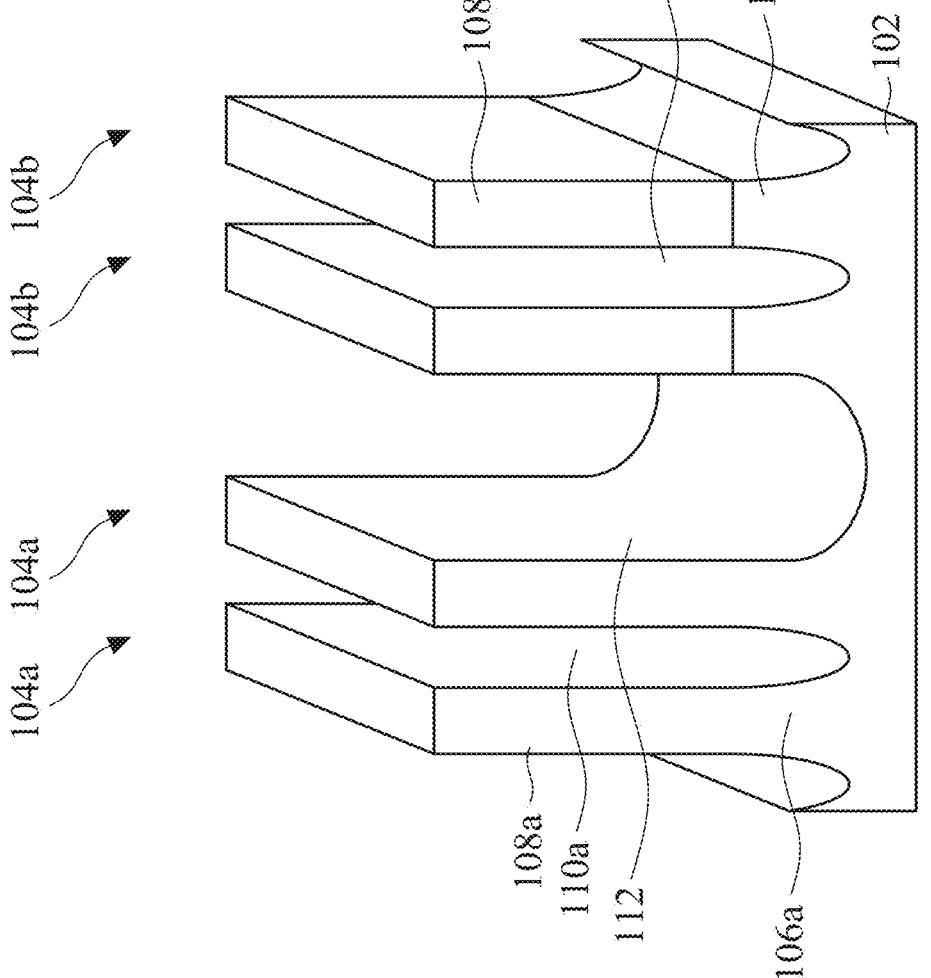
FIG. 1

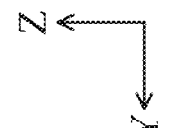
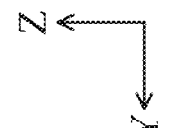
FIG. 3

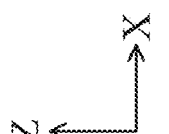
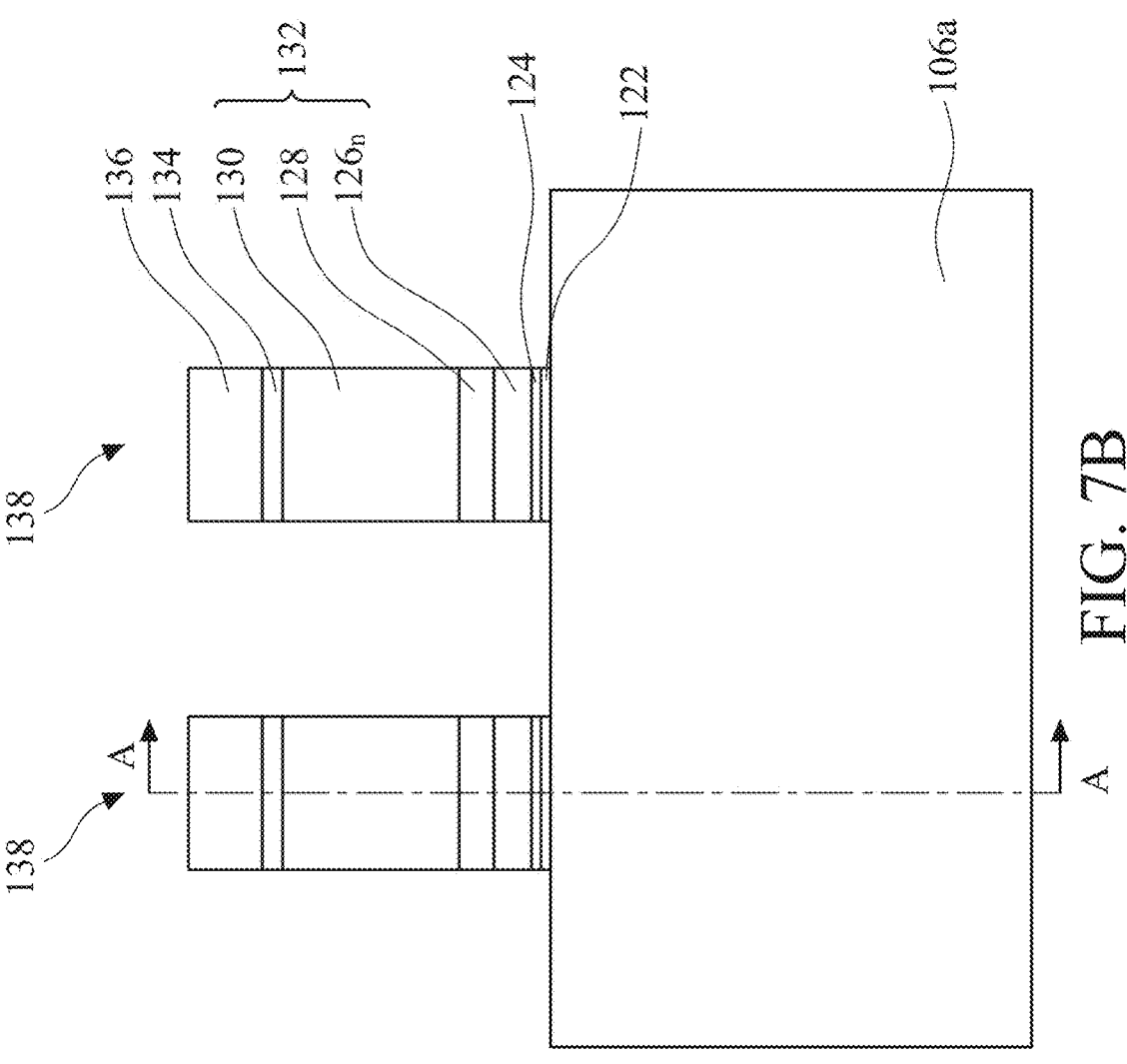
FIG. 7B

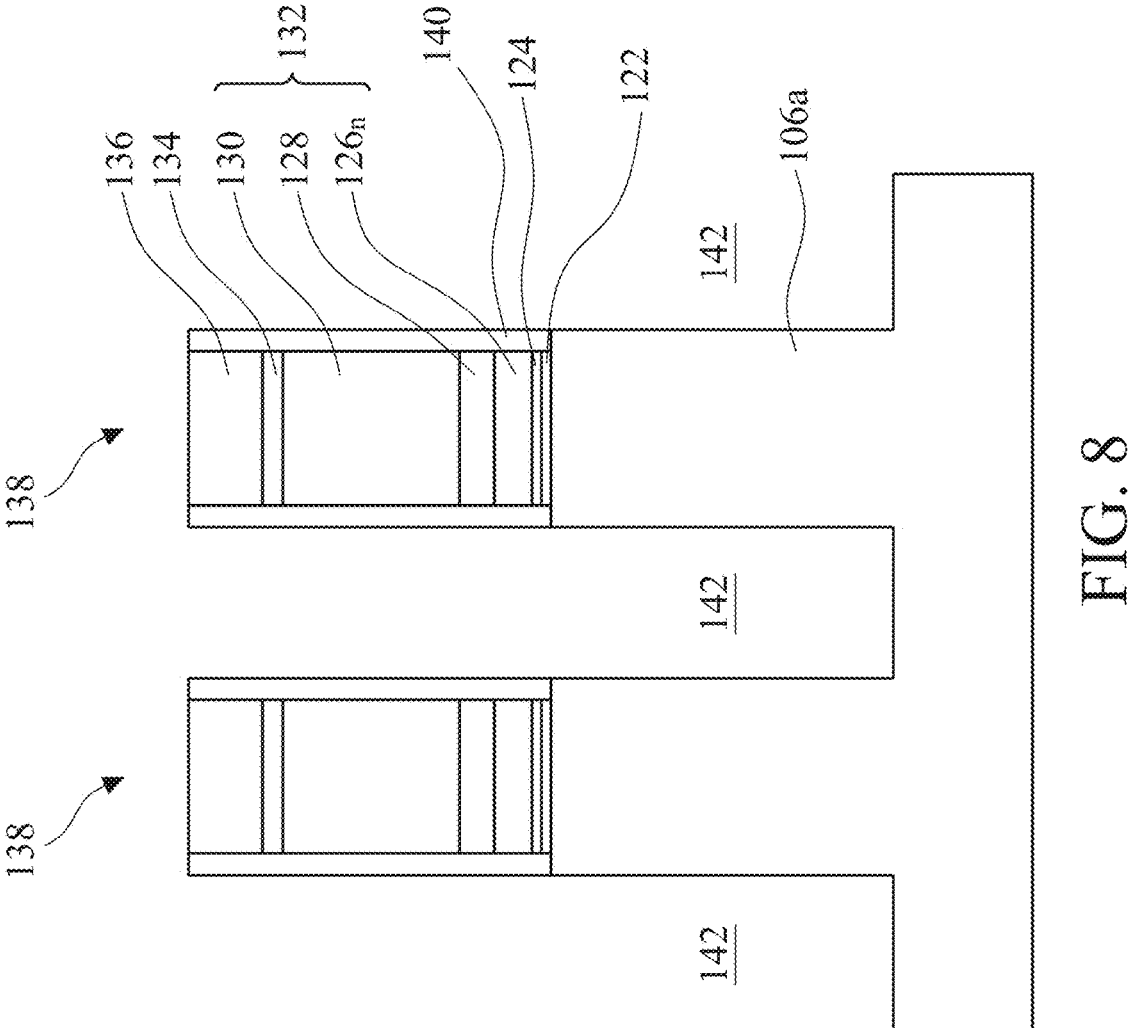
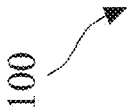
FIG. 8

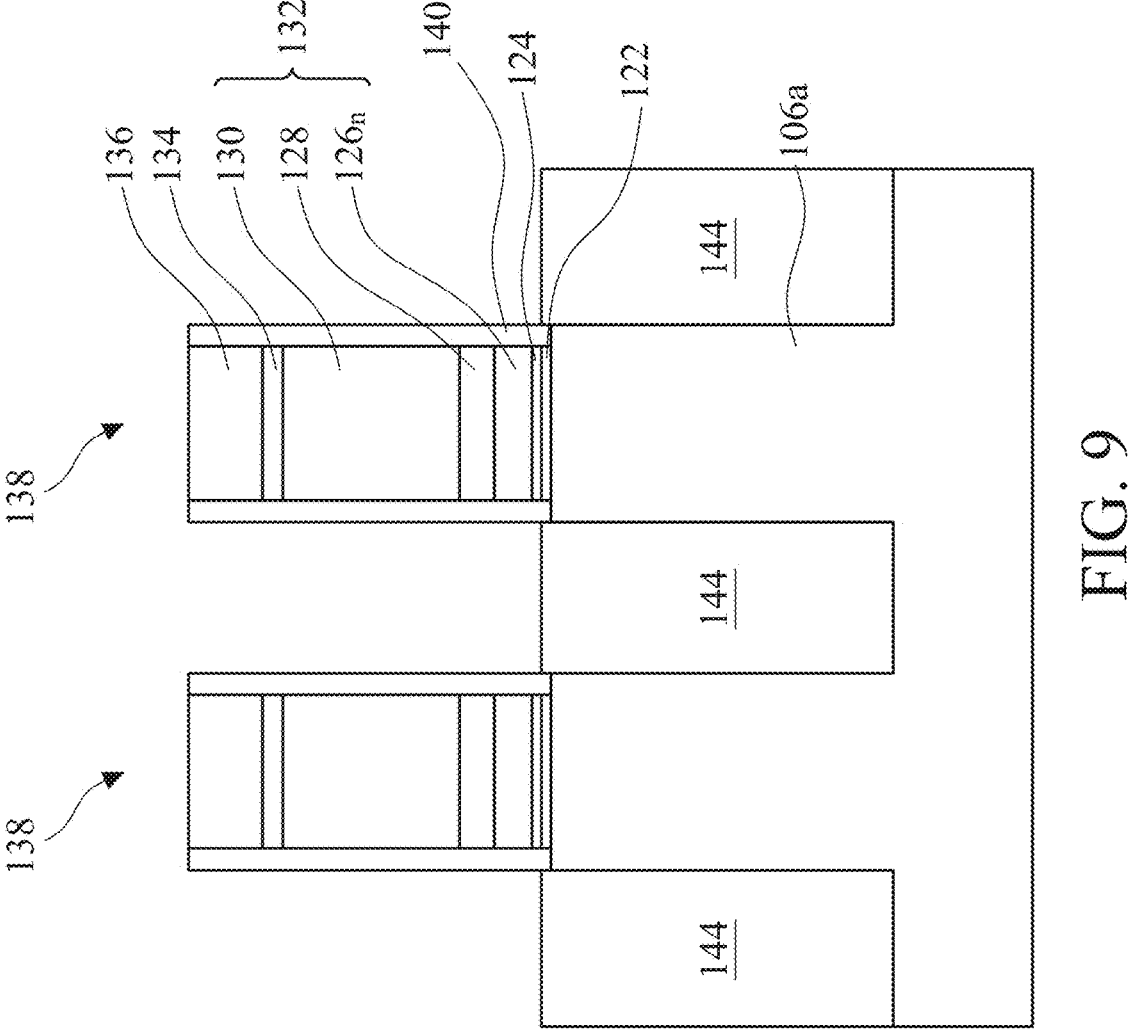
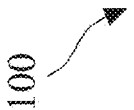
FIG. 9

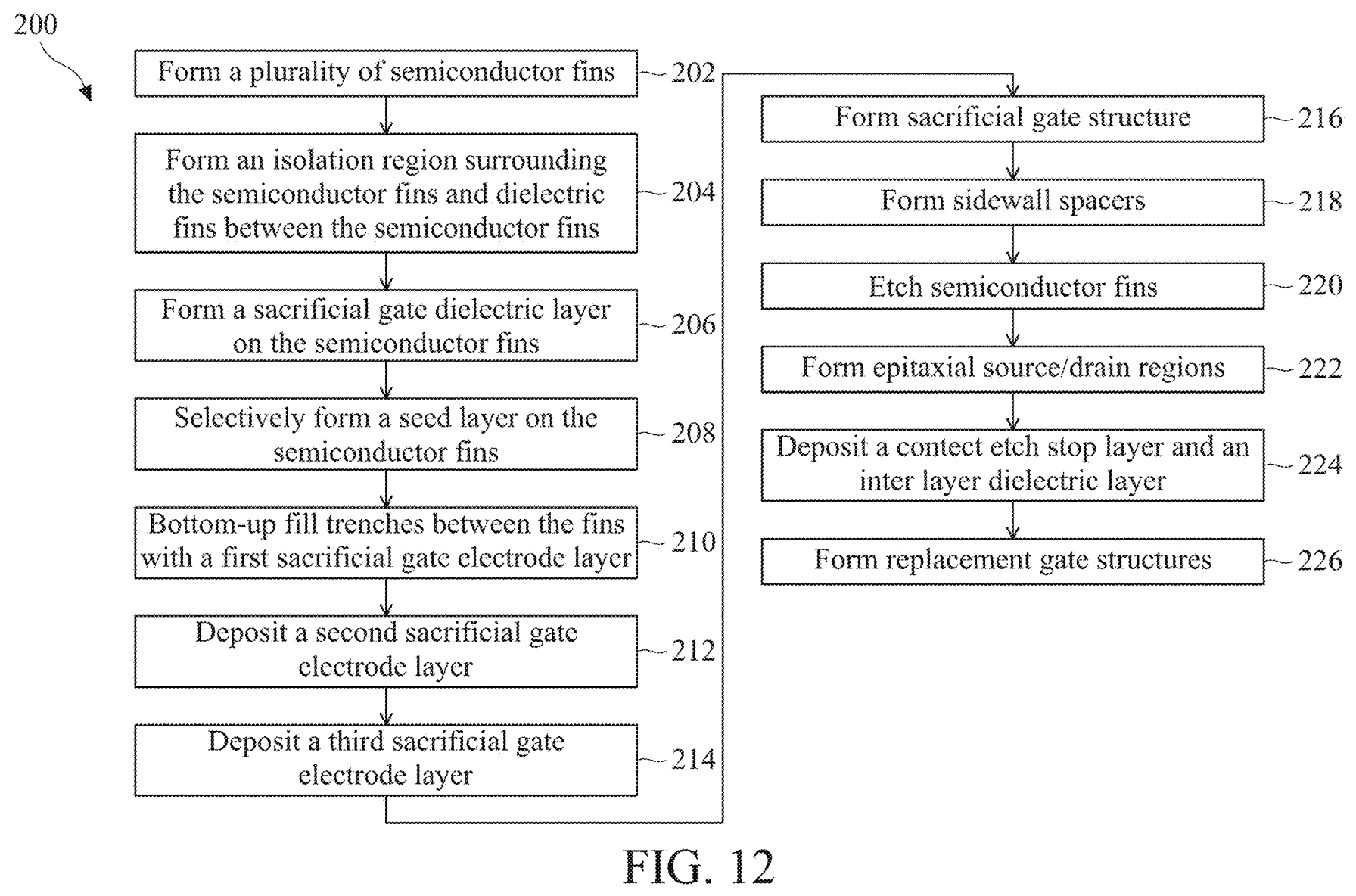

200

202 Form a plurality of semiconductor fins

204 Form an isolation region surrounding the semiconductor fins and dielectric fins between the semiconductor fins 206 Form a sacrificial gate dielectric layer on the semiconductor fins 208 Selectively form a seed layer on the semiconductor fins 210 Bottom-up fill trenches between the fins with a first sacrificial gate electrode layer 212 Deposit a second sacrificial gate electrode layer 214 Deposit a third sacrificial gate electrode layer 216 Form sacrificial gate structure 218 Form sidewall spacers 220 Etch semiconductor fins 222 Form epitaxial source/drain regions 224 Deposit a contact etch stop layer and an inter layer dielectric layer 226 Form replacement gate structures

FIG. 12

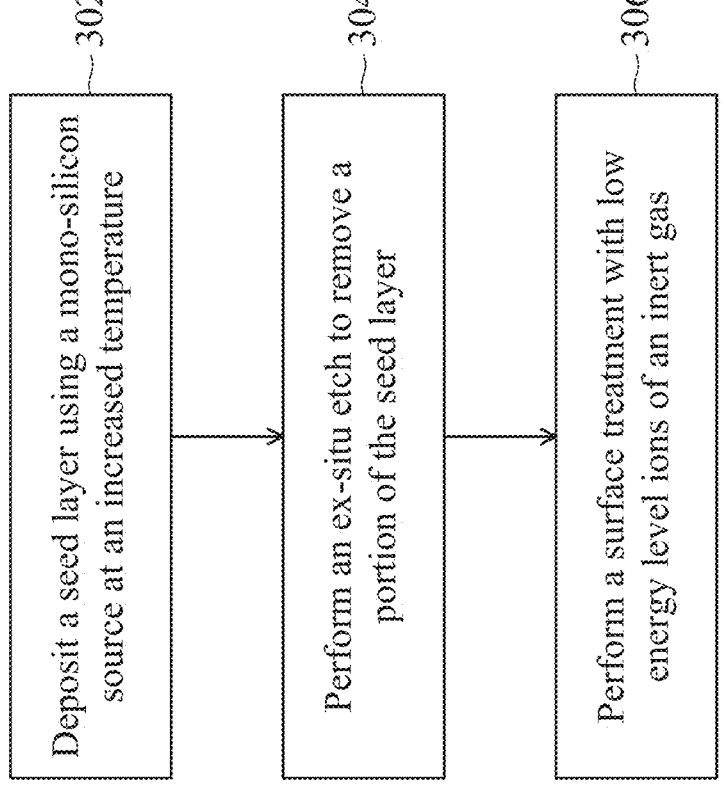
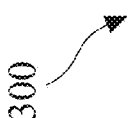
Deposit a seed layer using a mono-silicon source at an increased temperature ~302
Perform an ex-situ etch to remove a portion of the seed layer ~304
Perform a surface treatment with low energy level ions of an inert gas ~306
300
FIG. 13

METHOD FOR GAP FILLING WITH SELECTIVELY FORMED SEED LAYER AND HETEROEPITAXIAL CAP LAYER

BACKGROUND

With the increasing down scaling of semiconductor devices, various processing techniques are adapted to allow for the manufacture of devices with increasingly smaller dimensions. As semiconductor devices continue to shrink, the spacing between elements, i.e., the pitch, of a device also reduces. However, traditional techniques and/or process flows may hinder pitch reduction.

Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-3, 4A-4J, 5A-5F, 6A-6C, 7A-7B, 8-10, and 11A-11B are schematic perspective views of a semiconductor device at various stages of manufacturing the semiconductor device according to embodiments of the present disclosure.

FIG. 12 is a flow chart of an exemplary method for forming a semiconductor device according to embodiments of the present disclosure.

FIG. 13 is a flow chart of an exemplary method for forming a selective seed layer according to embodiments of the present disclosure.

DETAILED DESCRIPTION

Figure 2:
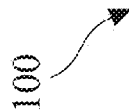

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

Gap-filling processes are used in various stages of FinFET fabrication. For example, depositing a sacrificial gate electrode layer in trenches between fin structures. As the dimension of the semiconductor device reduces, aspect ratio of trenches in FinFET also increases, which results in more challenges faced by trench gap-filling. The aspect ratio is even higher in trenches between semiconductor fins and dielectric fins. Embodiments of present disclosure provide a method for gap-filling. In some embodiments, a seed layer is selectively formed on sidewalls of trenches is deposited prior to a bottom-up gap filling deposition process. Compared to a uniform seed layer, the selective seed layer of the present disclosure reduces aspect ratio increase caused by the seed layer prior to gap filling. In some embodiments, a heteroepitaxial cap layer is used over the bottom-up gap filling layer. For example, a cap layer according to the present disclosure may include a layer of amorphous silicon (a-Si) and a layer of crystalline silicon (c-Si). Composition of the heteroepitaxial cap layer may be selected to tune profiles of semiconductor fins. For example, a-Si may be selected to reduce outward bending of fin structures, and c-Sil may be selected to achieve outward bending of fin structures.

FIGS. 1-3, 4A-4J, 5A-5F, 6A-6C, 7A-7B, 8-10, and 11A-11B schematically illustrate a semiconductor device 100 at various stages of fabrication according to a method according to the present disclosure. Particularly, FIGS. 1-3, 4A-4J, 5A-5F, 6A-6C, 7A-7B, 8-10, and 11A-11B are schematic views of the semiconductor device 100 at various stages of manufacturing the semiconductor device according to embodiments of the present disclosure. FIG. 12 is a flow chart of an exemplary method 200 for forming a semiconductor device according to embodiments of the present disclosure. As discussed below, the semiconductor device 100 may be fabricated using the method 200.

At operation 202 of the method 200, fin structures 104 are formed on a substrate 102, as shown in FIG. 1. FIG. 1 is a schematic perspective view of the semiconductor device 100 after operation 202. The substrate 102 may include a single crystalline semiconductor material such as, but not limited to Si, Ge, SiGe, GaAs, InSb, GaP, GaSb, InAlAs, InGaAs, GaSbP, GaAsSb, and InP. The substrate 102 may include various doping configurations depending on circuit design. For example, different doping profiles, e.g., n-wells, p-wells, may be formed in the substrate 102 in regions designed for different device types, such as n-type field effect transistors (NFET), and p-type field effect transistors (PFET). In some embodiments, the substrate 102 may be a silicon-on-insulator (SOI) substrate including an insulator structure for enhancement.

In some embodiments, the fin structures 104 may be formed depositing epitaxial semiconductor layers over the substrate 102 according to the device type to be formed. The fin structures 104 are then formed by lithography and etching processes using one or more patterning layers. In some embodiments, the fin structures 104 may include fin structures 104a for a first type of devices and fin structures 104b for a second type of devices.

Each of the fin structures 104a may include a well portion 106a formed in a first well region of the substrate 102, and a fin portion 108a formed from the epitaxially grown layer over the substrate 102. The fin portion 108a may include epitaxially grown silicon germanium (SiGe), epitaxially grown silicon (Si), or other epitaxially grown semiconductor materials, such as germanium (Ge), a compound semiconductor such as SiC, GeAs, GaP, InP, InAs, and/or InSb, an alloy semiconductor such as GaAsP, AlInAs, AlGaAs, InGaAs, GaInP, and/or GaInAsP, or combinations thereof. In some embodiments, the fin structures 104a are configured to function of channel regions for N-type devices. The well portion 106a may include p-type dopants. The fin portion 108a of the fin structures 104a may include epitaxially grown silicon.

Each of the fin structures 104b may include a well portion 106b formed in a second well region of the substrate 102, and a fin portion 108b formed from the epitaxially grown layer over the substrate 102. The fin portion 108b may include epitaxially grown Si, epitaxially grown SiGe, or other epitaxially grown semiconductor materials, such as Ge, a compound semiconductor such as SiC, GeAs, GaP, InP, InAs, and/or InSb, an alloy semiconductor such as GaAsP, AlInAs, AlGaAs, InGaAs, GaInP, and/or GaInAsP, or combinations thereof. In some embodiments, the fin structures 104b are configured to function of channel regions for P-type devices. The well portion 106b may formed in a n-well and includes n-type dopants. The fin portion 108b of the fin structures 104b may include epitaxially grown SiGe.

The fin structures 104 extend from the substrate 102 forming trenches between neighboring fins. As shown in FIG. 1, trenches 110a are formed between neighboring fin structures 104a, trenches 110b are formed between neighboring fin structures 104b, and trenches 112 are formed between neighboring fin structures 104a, 104b. The trenches 112 are wider than the trenches 110a, 110b. In some embodiments, dielectric fins may be subsequently formed in the trenches 112 to isolate transistors on opposite sides of the trenches 112.

In operation 204, isolation layer 114 and dielectric fin 120 are formed in trenches 110, 112 between the fin structures 104, as shown in FIG. 2. FIG. 2 is a schematic perspective view of the semiconductor device 100 after operation 204.

The isolation layer 114 is formed in the trenches between the fin structures 104 by a suitable deposition followed by an etch back process. The bottom profile of the isolation layer 114 is shown to be curved as an example. Depending on pitch and/or height of the fin structures 104, a bottom profile of the isolation layer 114 may vary, for example curved, substantially flat, or other shapes. The isolation layer 114 may be formed by a high-density plasma chemical vapor deposition (HDP-CVD), a flowable CVD (FCVD), or other suitable deposition process. In some embodiments, the isolation layer 114 may include silicon oxide, silicon nitride, silicon oxynitride, fluorine-doped silicate glass (FSG), a low-k dielectric, or combinations thereof.

In some embodiments, the isolation layer 114 may be conformally formed. After deposition of the isolation layer 114, the narrower trenches 110a, 110b may be fully filled while the wider trenches 112 are partially filled so that the dielectric fins 120 may be formed therein. In some embodiments, a liner layer 116 and a dielectric filling layer 118 are then sequentially deposited over the isolation layer 114 to fill the trench 112. The liner layer 116 may be selected from a dielectric material with etch selectivity to allow the isolation layer 114 to be etched back. In some embodiments, the liner layer 116 and dielectric filling layer 118 may include a low-k material, such as SiONC, SiCN, SiOC, or other dielectric material, that provide etch resistance during replacement gate processes.

After the trenches 110, 112 between the fin structures 104 are filled, a planarization process may be performed to expose the fin structures 104, and then recess etched using a suitable anisotropic etching process to remove a portion of the isolation layer 114. After the recess etch, the fin portions 108a, 108b of the fin structures 104a, 104b are exposed and extending from the isolation layer 114. In the trench 112, the dielectric fin 120 is formed. As shown in the example of FIG. 2, the dielectric fin 120 extends from the isolation layer 114. In some embodiments, the liner layer 116 may be etch from the dielectric filling layer 118 so that sidewalls of the dielectric fin 120 comprise the dielectric filling layer 118.

The dielectric fins 120, also referred to as dummy fins or hybrid fins, may include one or more layers of dielectric materials sequentially deposited within the trench 112. For example, the dielectric fins 120 may include a high-k dielectric material layer, such as $HfO_2$, $ZrO_2$, $HfAlO_x$, $HfSiO_x$, $Al_2O_3$, and the like; a low-k dielectric material layer, SiONC, SiCN, SiOC, or other dielectric material; or a bi-layer dielectric material including high-k upper part and a low-k lower part. In some embodiments, an external layer of the dielectric fins 120 may be selected from a material to facilitate selective formation of a seed layer, as discussed below. In some embodiments, sidewalls 120s of the dielectric fins 120 comprise SiCN. In some embodiments, the sidewalls 120s of the dielectric fins 120 comprises SiCN with a carbon molar concentration in a range between about 8% and about 16%, for example about 12%.

After operation 204, the fin structures 104 have a height H1 along the Z-direction over the isolation layer 114. The height H1 may vary according to circuit design. In some embodiments, the height H1 is in a range between about 20 nm to about 100 nm. The trenches 110a, 110b have a width W1 along the Y direction. In some embodiments, the width W1 is in a range from about 3 nm to about 50 nm.

In some embodiments, the dielectric fins 120 may extend from the isolation layer 114 for the substantially the same height H1 as the fin structures 104. Trenches 112a, 112b are formed on opposite sides of the dielectric fin 120. In some embodiments, the trenches 112a, 112b have a width W2 along the Y direction. In some embodiments, the width W2 is in a range from about 3 nm to about 50 nm. In some embodiments, the width W2 may be narrower than the width W1.

In operation 206, a sacrificial gate dielectric layer 122 is formed over the fin structures 104, as shown in FIG. 3. FIG. 3 is a schematic cross-sectional view of the semiconductor device 100. The sacrificial gate dielectric layer 122 is formed over the fin structures 104. The sacrificial gate dielectric layer 122 may include oxides of semiconductor material. In some embodiments, the sacrificial gate dielectric layer 122 may be thermally grown from the fin structures 104 according to acceptable techniques, such as thermal CVD, CVD, ALD, and other suitable methods.

In some embodiments, the sacrificial gate dielectric layer 122 may have a thickness in a range between about 1 nm and about 3 nm. As shown in FIG. 3, after formation of the sacrificial gate dielectric layer 122, width of the trenches 110a/110b and 112a/112b may be reduced to width W1' and W2' respectively. Aspect ratio, i.e. a ratio of the fin height H1 over the widths W1'/W2', of the trenches 110a/110b and 112a/112b are increased. In some embodiments, the aspect ratio of the trenches 110a/110b and 112a/112b may be greater than 5. A greater aspect ratio makes it difficult to fill the trenches 110a/110b and 112a/112b with a sacrificial gate electrode layer. For example, seams and/or voids may be formed in the sacrificial gate electrode layer. The seams and voids may lead to allow epitaxial source/drain or source/drain contact to sip in the gate structure, causing leakage. Operations 208-214 provide an improve gap filling process to form a sacrificial gate electrode layer between the trenches 110a/110b and 112a/112b and over the fin structures 104.

Figure 4A:
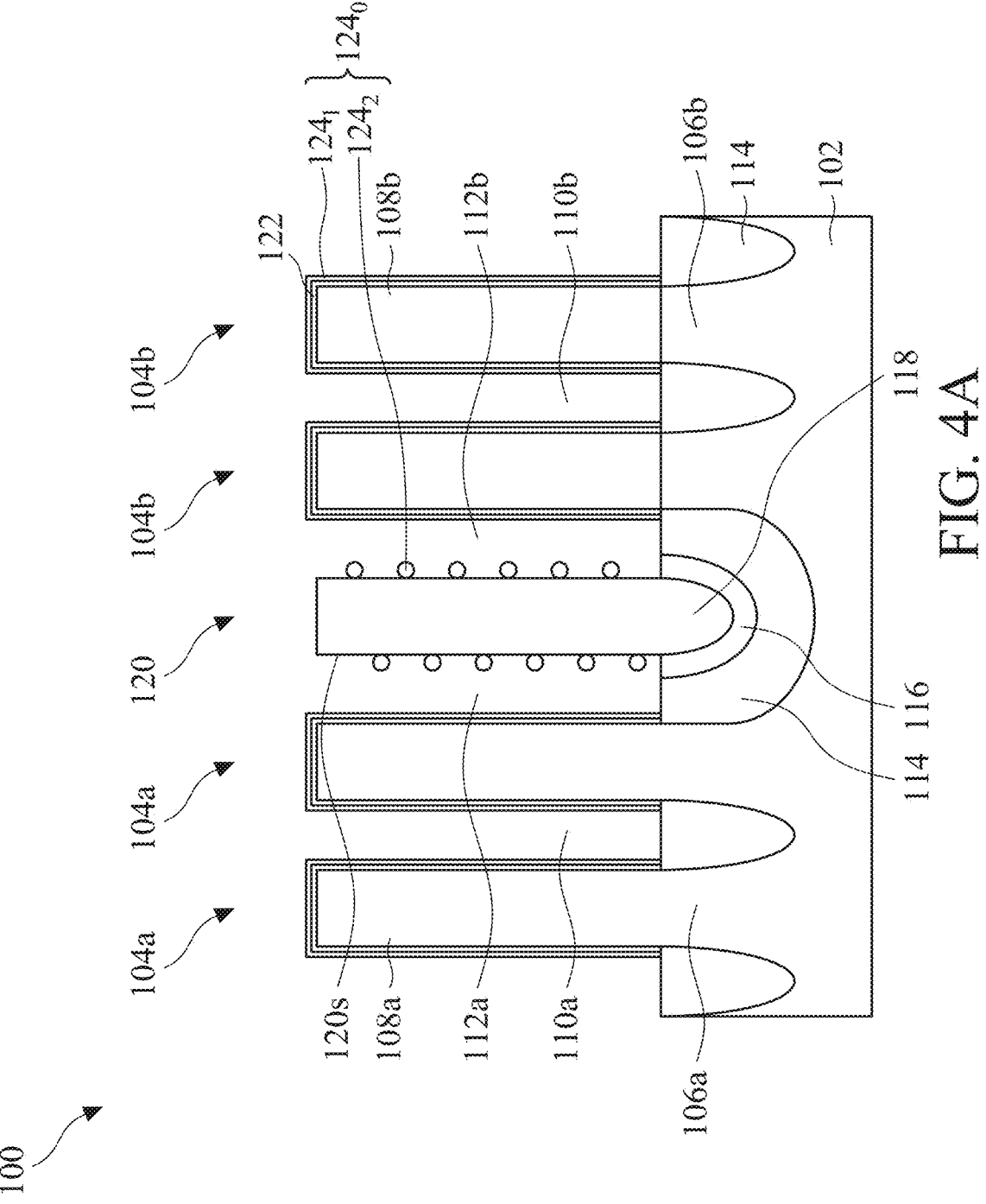
Figure 4B:
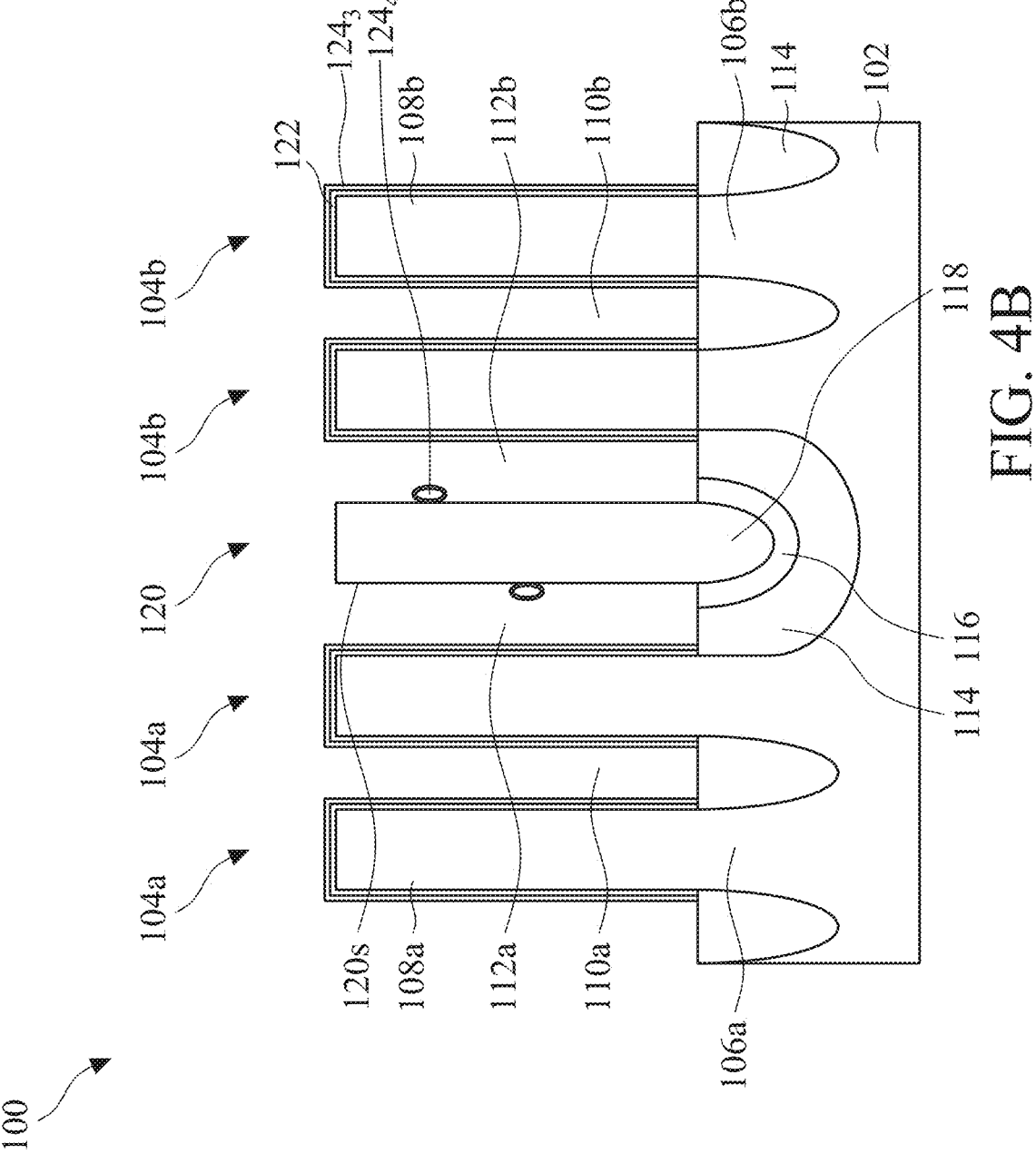
Figure 4C:
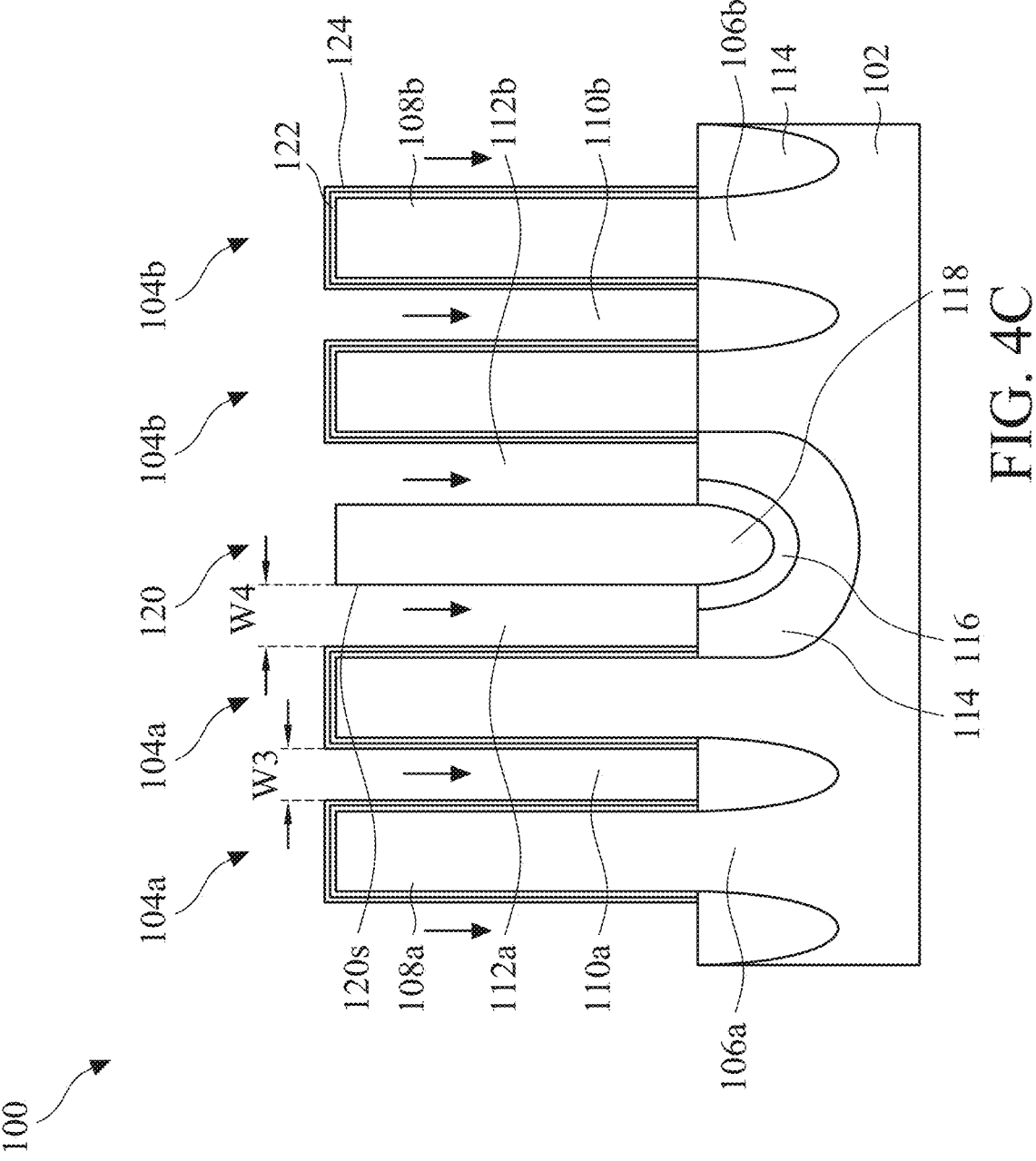

In operation 208, a seed layer 124 is selectively formed over the fin structures 104, as shown in FIGS. 4A-4C. Particularly, the seed layer 124 are formed over the sidewalls of the fin structures 104, but not on the sidewalls 120s of the dielectric fin 120. By selectively forming the seed layer 124 on the semiconductor fin structures 104, embodiments of the present disclosure avoid further increasing aspect ratio of the trenches between the semiconductor fins and the dielectric fins, such as the trenches 112a, 112b. FIGS. 4A-4C are cross-sectional views of the semiconductor device 100 during various phases of forming the seed layer 124.

In some embodiments, the seed layer 124 may be formed by a deposition process, an etch process, and a surface treatment. For example, the operation 208 may be performed using a method 300 shown in FIG. 13.

The method 300 includes an operation 302, a non-uniform deposition process is performed to deposit a seed layer $124_0$ over the semiconductor device 100, as shown in FIG. 4A. The seed layer $124_0$ includes a thicker and continuous portion $124_1$ formed over the semiconductor fin structures 104 and a thinner and discontinuous portion $124_2$ formed over the dielectric fin 120. In some embodiments, the seed layer $124_0$ is a silicon seed layer. In some embodiments, the seed layer $124_0$ may be a silicon layer free from other elements such as germanium, n-type impurities (such as phosphorous and arsenic), and p-type impurities (such as boron and indium). In some embodiments, the thicker and continuous portion $124_1$ of the seed layer $124_0$ may have a thickness in the range between about 5 Å and about 25 Å. The thinner and discontinuous portion $124_2$ of the seed layer $124_0$ may have a single atomic layer of silicon that is not continuous.

The seed layer $124_0$ may be deposited using a suitable deposition, such as atomic layer deposition (ALD). The non-uniformity or selectivity of the deposition may be achieved by selecting a suitable precursor and a suitable processing condition according to the surface composition on the fin structures 104 and the dielectric fin 120. In some embodiments, the seed layer $124_0$ is deposited using a mono-silicon containing precursor and at an increased temperature to reduce deposition rate on the sidewalls 120s of the dielectric fin 120. In some embodiments, when the sidewalls 120s of the dielectric fin 120 includes SiCN while the fin structures 104a, 104b are Si and SiGe, the seed layer $124_0$ may be deposited using monosilane ($SiH_4$). The deposition may be performed at a temperature in a range between about 460° C. and about 480° C., for example, about 470° C.

The method 300 further includes an operation 304 performed after the operation 302. In operation 304, an etch process is performed to remove a portion of the seed layer $124_0$. In some embodiments, the dry etch process may be an ex-situ dry etch process performed to substantially remove the thinner and discontinuous portion $124_2$ of the seed layer $124_0$, as shown in FIG. 4B.

In some embodiments, the dry etch process may be an isotropic etch process. In some embodiments, the etchant gas may include a mixture of chlorine ($Cl_2$) and nitrogen ($N_2$), a mixture of fluorine ($F_2$) and nitrogen ($N_2$), or a mixture of $NF_3$, $H_2$, and helium (He), or HCl. In some embodiments, the etching may be performed using, for example, Reactive Ion Etch (RIE). In some embodiments, the etching process may be performed for a time period between about 3 seconds and 8 seconds, for example about 5 seconds.

As shown in FIG. 4B, after the etch process in operation 304, the thinner and discontinuous portion $124_2$ of the seed layer $124_0$ may be substantially removed from the dielectric fins 120. The thicker and continuous portion $124_1$ of the seed layer $124_0$ is reduced to a continuous portion $124_3$, which a thickness in the range between about 3 Å and about 20 Å. In some embodiments, agglomerates $124_4$ may result on surfaces of the semiconductor device 100, such as on the sidewalls 120s of the dielectric fin 120.

The method 300 further includes an operation 306, in which a surface treatment is performed to remove particles and agglomerates $124_4$, as shown in FIG. 4C. In some embodiments, the surface treatment in the operation 306 may be a selective surface treatment to achieve highly selective surface property modification, for example to selectively remove the surface agglomerates $124_4$. In some embodiments, the surface treatment may be performed by flowing inert atoms, such as argon, over the surface of the semiconductor device 100 to a process chamber and generating very gentle radical plasma to remove the agglomerates $124_4$. For example, the radials used during the surface treatment carry an energy in a range between about 1% to about 10% of the plasma energy level during a plasma each. For example, the radials may be argon atoms at an energy level around 11.7 eV. In some embodiments, the surface treatment may be performed using Argos system by Lamb Technologies, Inc.

FIG. 4C schematically illustrates the semiconductor device 100 after operation 208. As shown in FIG. 4C, the seed layer 124 is selectively formed over the semiconductor fin structures 104 while no seed layer is formed over the dielectric fin 120.

Figure 4D:
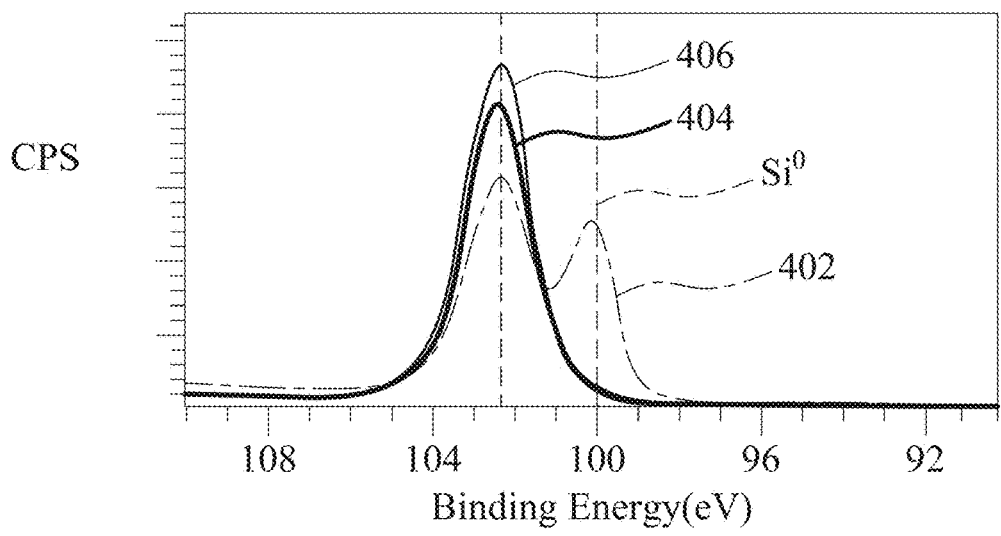
Figure 4E:
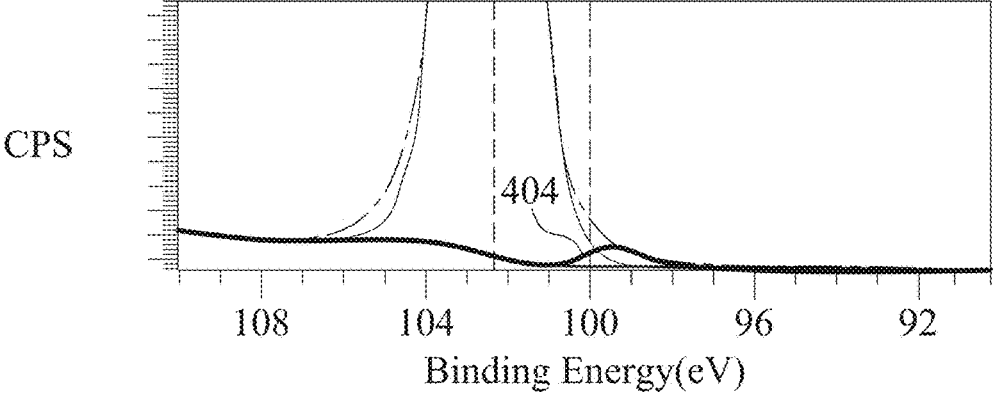
Figure 4F:
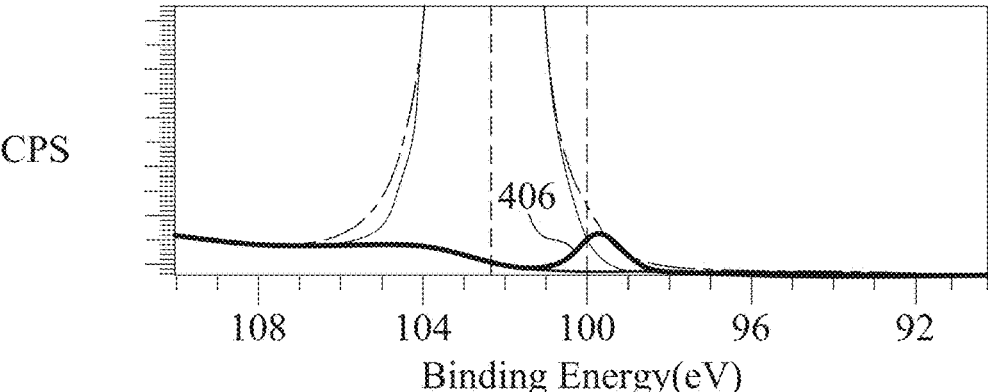

It has been proven that when forming a dielectric fin with SiCN containing surface and using monosilane as a precursor to deposit a silicon seed layer, the silicon seed layer can be selectively deposited on the semiconductor fins. FIGS. 4D-4F are schematic plot of surface composition using x-ray photoelectron spectroscopy (XPS) on a SiCN surface having 12% of carbon in molar percentage under different deposition conditions. In FIG. 4D, curve 402 is a plot of normalized surface composition of on the SiCN surface using disilane ($Si_2H_6$), as precursor; curve 404 is a plot of normalized surface composition of on the SiCN surface using monosilane as precursor and deposition time is 18 minutes; curve 406 is a plot of normalized surface composition of on the SiCN surface using monosilane as precursor and deposition time is 34 minutes. As shown in curve 402, using disilane as precursor, a silicon seed layer, represented by the peak at energy level $Si^0$, is formed. In comparison, there is no peak at the energy level $Si^0$ along the curves 404 and 406, which indicates that when using monosilane as precursor, a silicon seed layer would not form on the SiCN surface even if the deposition time is nearly doubled. FIGS. 4E and 4F are enlarged plots showing the curves 404 and 406 showing the concentration of Si⁰.

In some embodiments, the seed layer 124 may be a continuous silicon layer having a thickness in a range between about 3 Å and about 20 Å. As a result of the seed layer 124, the width of trenches between semiconductor fins, i.e. the trenches 110a, 110b, is reduced from the width W1 to the width W3, and the width of trenches between a semiconductor fin and a dielectric fin, i.e. the trenches 112a, 112b, is reduced from the width W2 to the width W4. The reduction from the width W1 to the width W3 is greater than the reduction from the width W2 to the width W4.

Figures 4G, 4H:
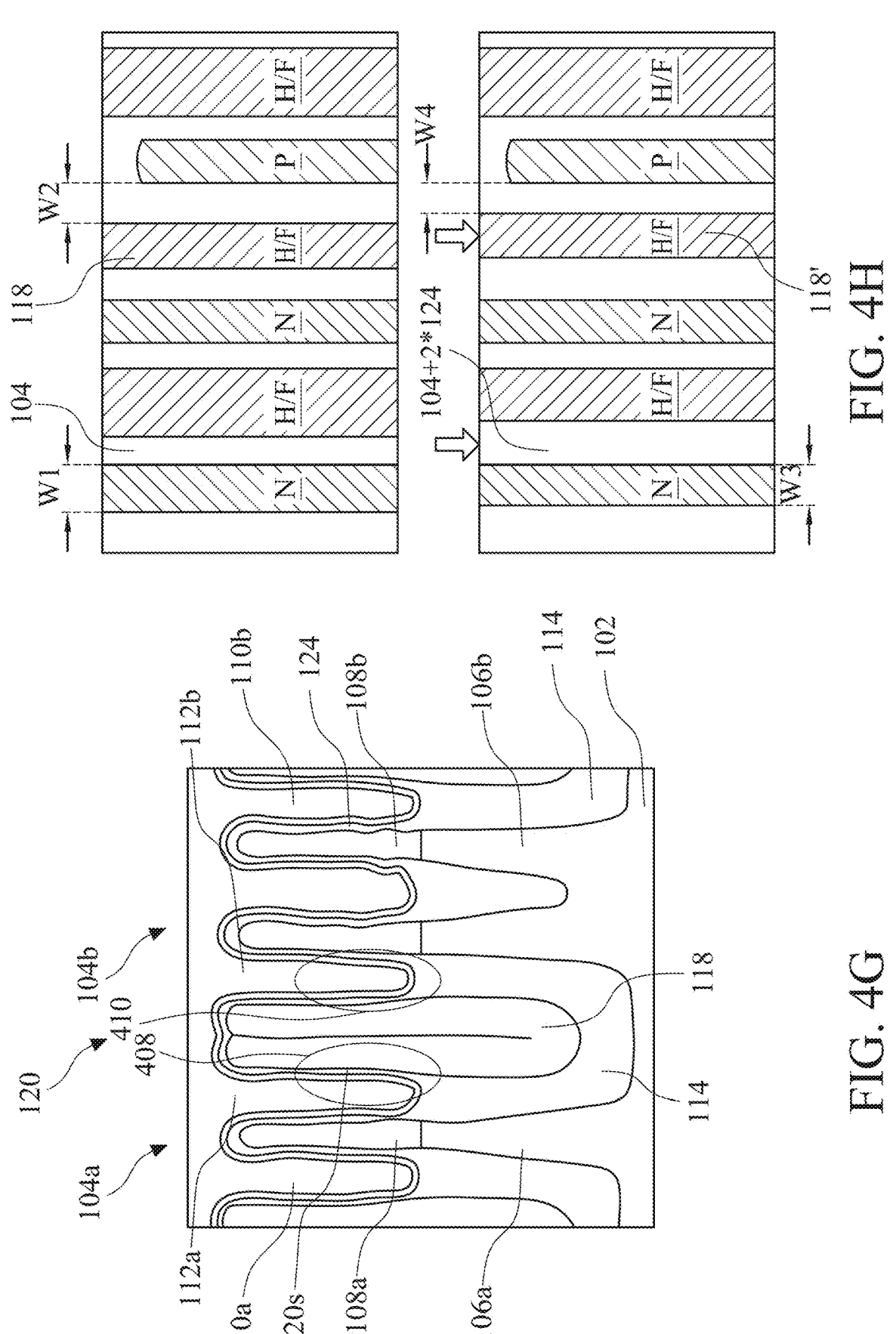

FIG. 4G is an example device showing a cross sectional view of fin structures with a selectively formed silicon seed layer according to embodiments of the present disclosure. The silicon seed layer 124 is formed on sidewalls of the semiconductor fin structures 104a, 104b. As shown in regions 408, 410, there is no growth of the silicon seed layer 124 on the sidewalls 120s of the dielectric fin 120.

FIG. 4H include TEM showing top views of the fin structures before and after forming the seed layer 124 in the operation 208. As shown in FIG. 4H, after forming the seed layer 124, width of the semiconductor fin structures 104 increases by two times the thickness of the seed layer 124 while width of the dielectric fin 120 does not increase. In some embodiments, the dielectric fin 120 may reduce during the post deposition etch in operation 304 and the surface treatment in operation 306. As a result, the width of the trenches 110a, 110b is reduced by about two thicknesses of the seed layer 124, the width of the trenches 112a, 112b adjacent the dielectric fin 120 reduces at the most by one thickness of the seed layer 124. Because the dielectric fin 120 may lose some thickness, the overall width W4 after operation 208 of the trenches 112a, 112b increase for about 1 nm from W2. Therefore, comparing uniform seed layer deposition, embodiments of the present disclosure enlarge spaces in the trenches 112a, 112b between the dielectric fin 120 and the semiconductor fin structures 104.

In some embodiment, when the semiconductor fin structures 104 include Ge, e.g. SiGe, the silicon seed layer deposited according to the present disclosure may improve Ge abruptness performance, therefore, preventing Ge diffusion and avoiding SiGe oxidation. As a result, the silicon seed layer 124 according to the present disclosure improves interface trap density (D_it) at the germanium containing channels.

Figure 4I:
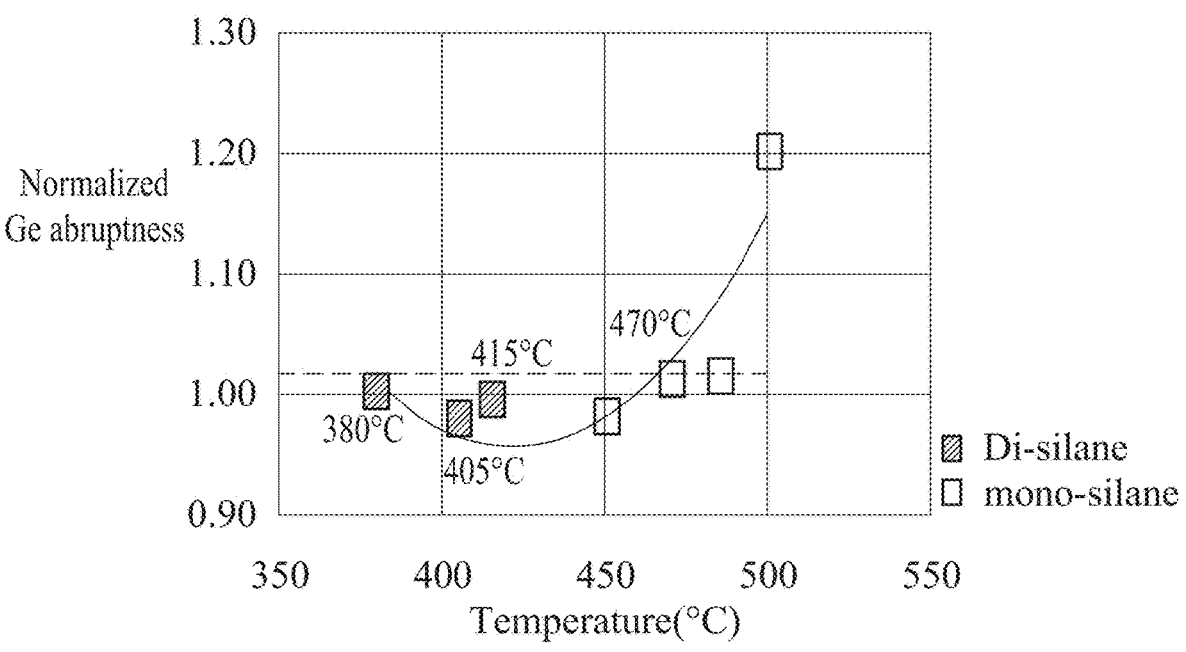
Figure 4J:
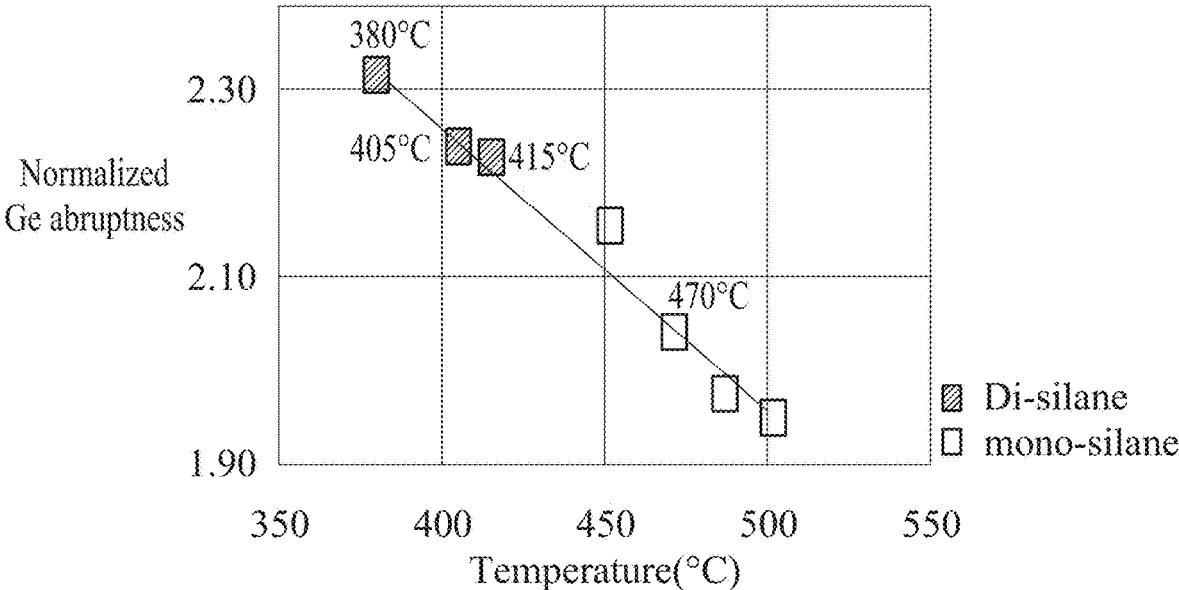

FIGS. 4I-4J illustrate normalized germanium abruptness corresponding to the silicon seed layer formed using disilane and monosilane at different temperatures. Particularly, FIGS. 4I-4J include Ge abruptness corresponding to silicon seed layers formed using disilane at 380° C., 405° C., 415° C., and using monosilane at 450° C., 470° C., 485° C., 500° C. FIG. 4I shows Ge abruptness at amorphous silicon deposition. FIG. 4J shows Ge abruptness at subsequent anneal. Not meaning to be bound by theory, at low temperatures, there are less germanium segregation while at high temperatures, material intents to complete lattice structure before Ge segregation. As shown in FIGS. 4I and 4J, silicon seed layer formed using disilane at 405° C. has better Ge abruptness at amorphous silicon deposition and anneal than silicon seed layer formed using disilane at 380° C. Silicon seed layer formed using disilane at 415° C. and silicon seed layer formed using monosilane at 470° C. have comparable Ge abruptness at amorphous silicon deposition, and better Ge abruptness during anneal than silicon seed layer formed using disilane at 380° C.

Figure 5A:
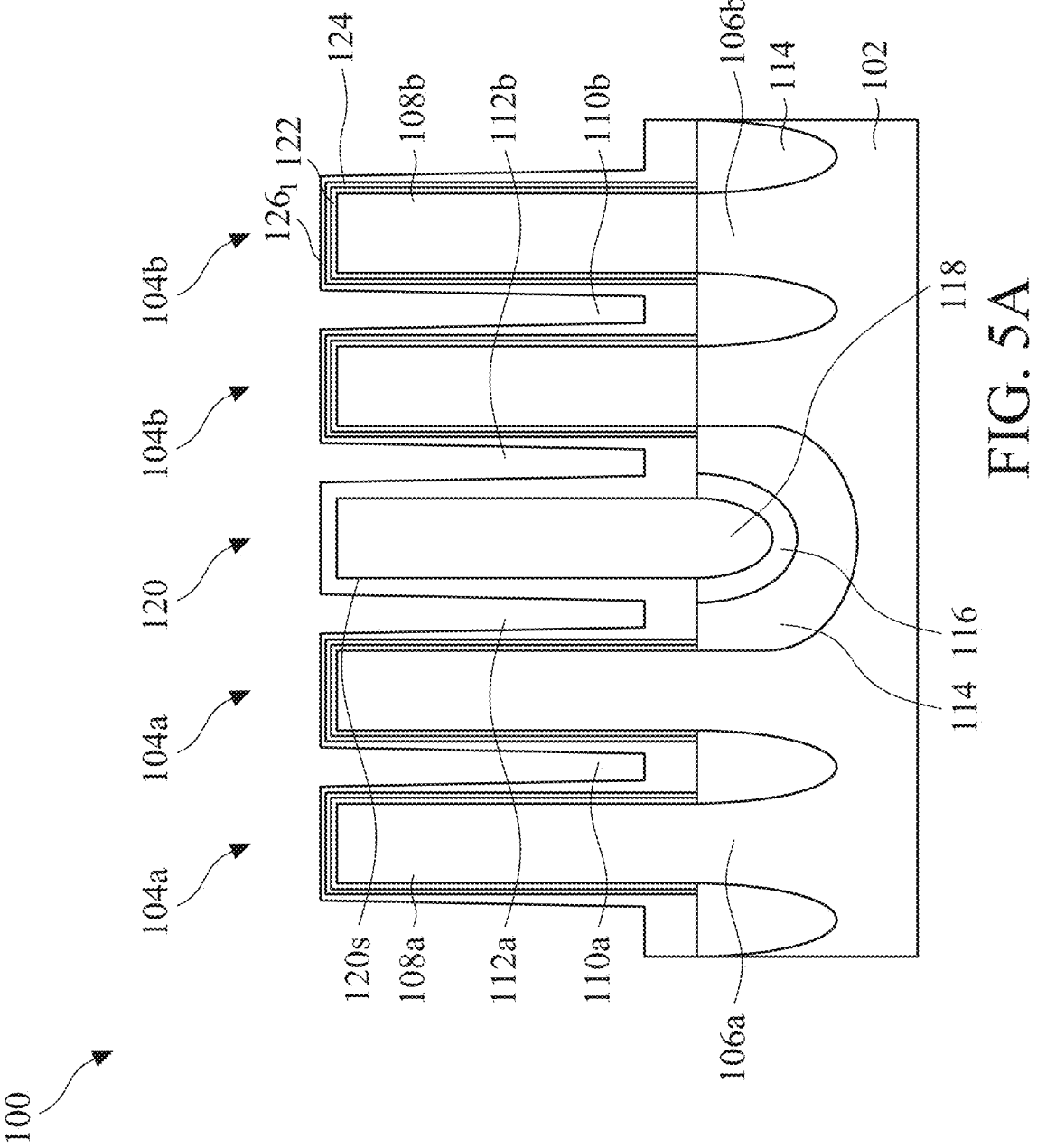
Figure 5B:
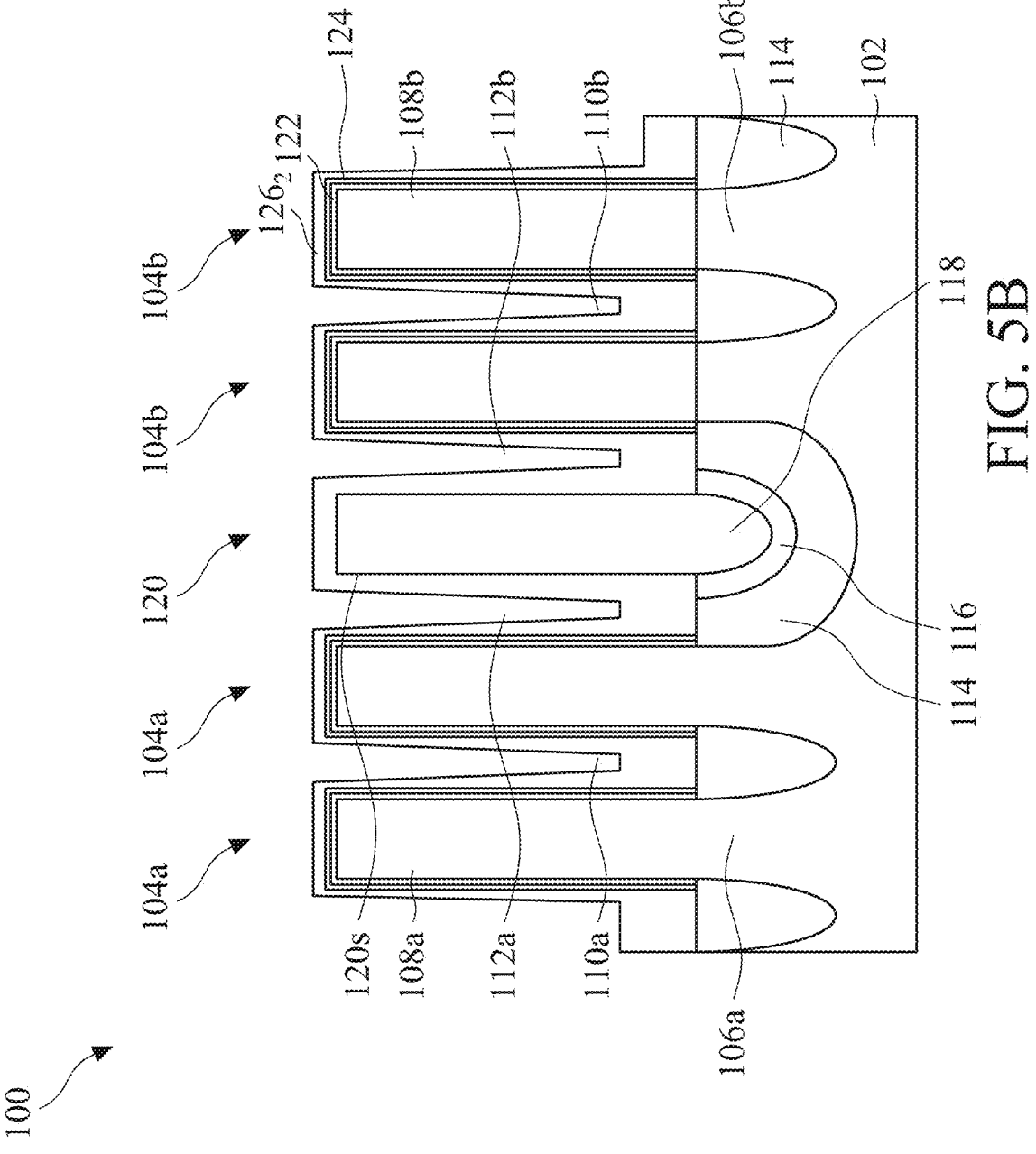
Figure 5C:
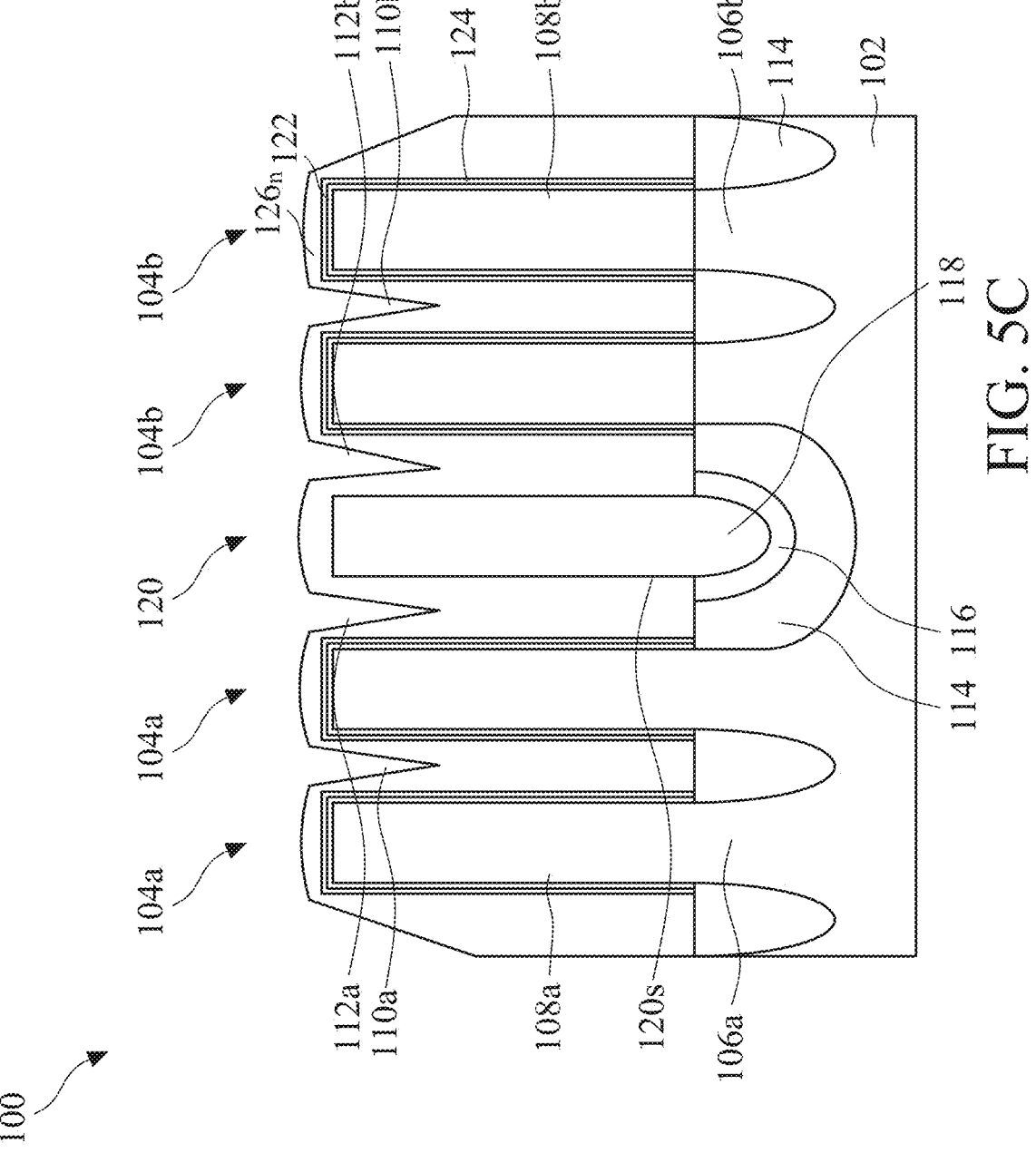

In operation 210, a bottom-up gap deposition is performed to form a silicon layer 126 over the fin structures 104, the dielectric fins 120, and in the trenches 110, 112, as shown in FIGS. 5A-5C. In some embodiments, the silicon layer 126 may be formed by one or more deposition-anneal-etch cycles to achieve bottom-up gap filling in the trenches 110, 112. FIGS. 5A-5C are cross sectional views of the semiconductor device 100 after the first, second, and final deposition-anneal-etch cycles respectively.

After the formation of the silicon seed layer 124, silicon may be grown on the silicon seed layer 124 using a silicon-containing precursor such as disilane ($Si_2H_6$), monosilane ($SiH_4$), or the mixture of disilane and monosilane. The temperature for growing the silicon layer using disilane may be in the range between about 350° C. and about 400° C. The temperature for growing the silicon layer using monosilane may be in the range between about 400° C. and about 500° C. Depending on the temperature, the growth rate of silicon layer 126, and other process conditions, silicon layer 126 may be an amorphous silicon layer or a polysilicon layer. During the deposition step of each deposition-anneal-etch cycle, the silicon layer 126 may be formed as a conformal layer.

After deposition, an anneal is performed. In some embodiments, the anneal is performed at a temperature in the range between about 450° C. and about 600° C. The anneal may last between about 2 minutes and about 2 hours, depending on the temperature, with a higher temperature corresponding to a shorter anneal time, and a lower temperature corresponding to a longer anneal time. During the anneal, process gases such as nitrogen ($N_2$) or hydrogen ($H_2$) may be introduced. As a result of the anneal, silicon atoms migrate. The migration of the silicon atoms may involve the anneal breaking hydrogen atoms (coming from the precursors) from silicon atoms. The silicon atoms having the dangling bonds tend to migrate to the places with higher surface energies or lower potential, and eventually reduce the total system energy by filling the trenches 110, 112. The silicon atoms with the dangling bonds are then bonded with other silicon atoms. The migration of silicon atoms from higher places to lower places is similar to the reflow of silicon, although at the anneal temperature, silicon is neither molten nor partially molten. The migration of silicon atoms results in a bottom-up effect, that is, more silicon migrates to the bottom of trenches, which is equivalent to growing silicon in a bottom-up way. And the migration of silicon causes the sidewalls of silicon layer 126 to be smoothened and necking profile near entrances of the trenches 110, 112 may be reduced or eliminated.

After the anneal process, an etch-back process may be performed on silicon layer 126 to form an improved trench profile, i.e. more V-shape like, for the subsequent gap-fill process. In some embodiments, the etch-back process may use an etchant gas comprising chlorine ($Cl_2$), for example an etchant including a mixture of chlorine ($Cl_2$) and nitrogen ($N_2$), a mixture of fluorine ($F_2$) and nitrogen ($N_2$), or a mixture of $NF_3$, $H_2$, and helium (He), or HCl. In some embodiments, the etch-back is isotropic etch, for example, without applying bias power in the etching chamber during the etch-back.

As shown in FIGS. 5A-5C, each deposition-anneal-etch cycle, profiles of the silicon layer $126_1$, $126_2$, $126_n$ may sequentially become rounded with greater thickness at bottoms of the trenches 110, 112. The deposition-anneal-etch cycle in operation 210 when the profile of the silicon layer $126_n$ in the trenches 110, 112 are V-shaped and may be filled with a bulk deposition.

Figure 5D:
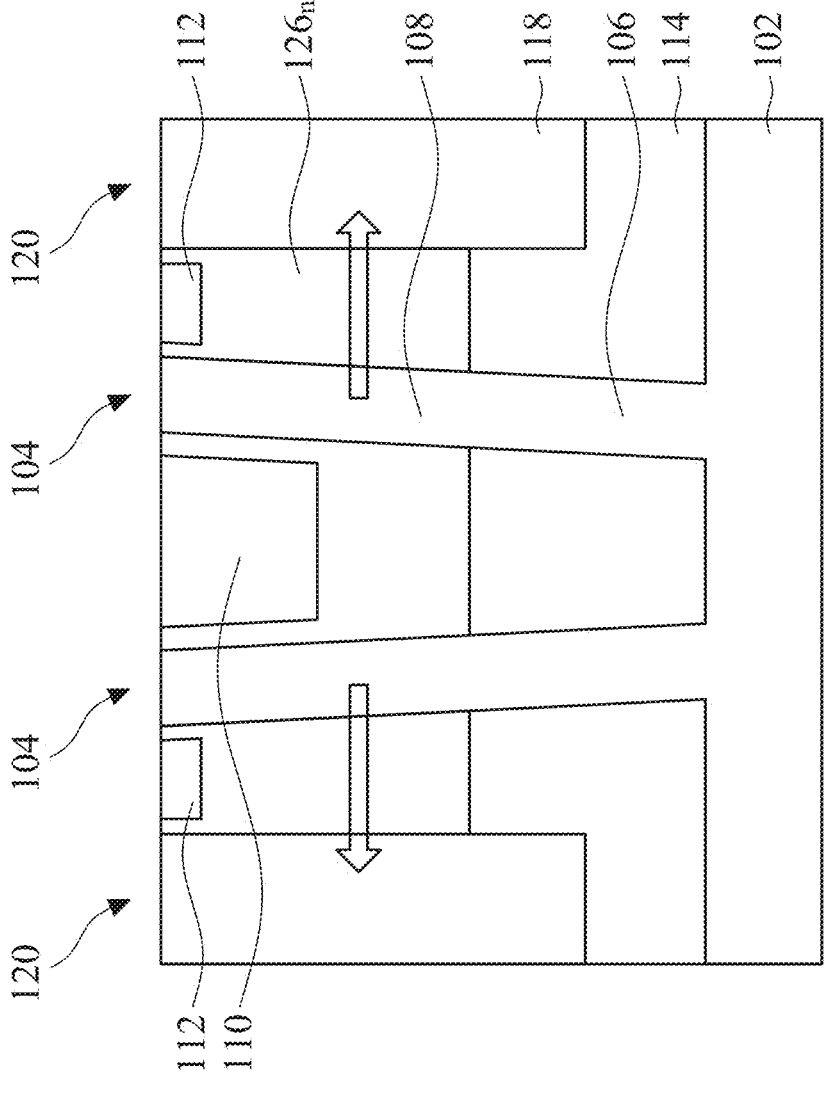

It has been observed that during bottom-up deposition the fin structures 104 may bend due to unbalanced forces on opposing sides of the fin structures 104. FIG. 5D is a schematic view of the semiconductor device 100 with outward bending fin structures 104 after bottom-up deposition of the silicon layer 126. As shown in FIG. 5D, the trenches 112 between the fin structures 104 and the dielectric fin 120 are narrower than the trench 110 between the fin structures 104. The silicon layer 126 fills up the narrower trenches 112 faster than the wider trenches 110. As a result, the fin structures 104 bend outwards from the trench 110 and towards the dielectric fins 120.

Figure 5F:
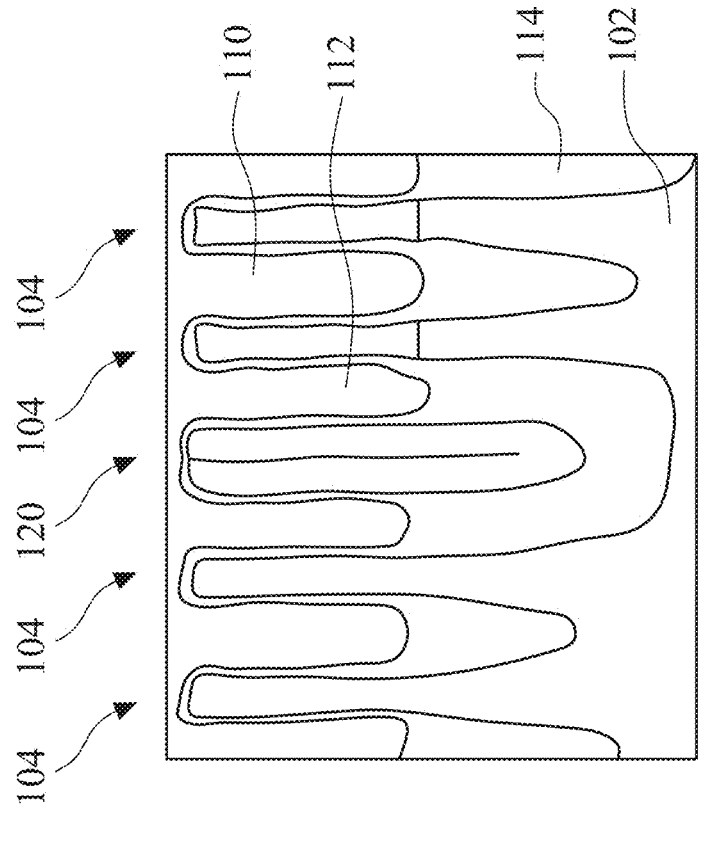
Figure 5E:
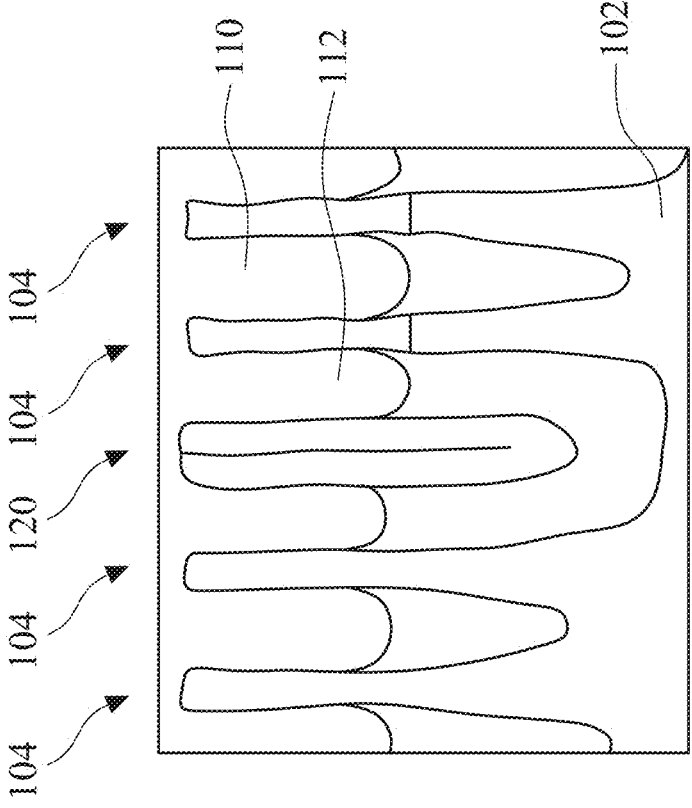

FIG. 5E is a TEM image of a semiconductor device after recess of isolation layer. FIG. 5F is a TEM image of the semiconductor device after formation of the silicon layer 126 according to embodiments of the present disclosure. As shown in FIGS. 5E and 5F, the silicon layer 126 causes the semiconductor fin structures 104 bend outwards from each other and towards the neighboring dielectric fins 120. According to embodiments of the present disclosure, bending of the semiconductor fin structures 104 may be reduced or controlled by selecting suitable crystalline structure of one or more cap silicon layers above the silicon layer 126. For example, depositing an amorphous silicon cap layer on the silicon layer 126 to reduce outward bending of the fin structures 104.

Figure 6A:
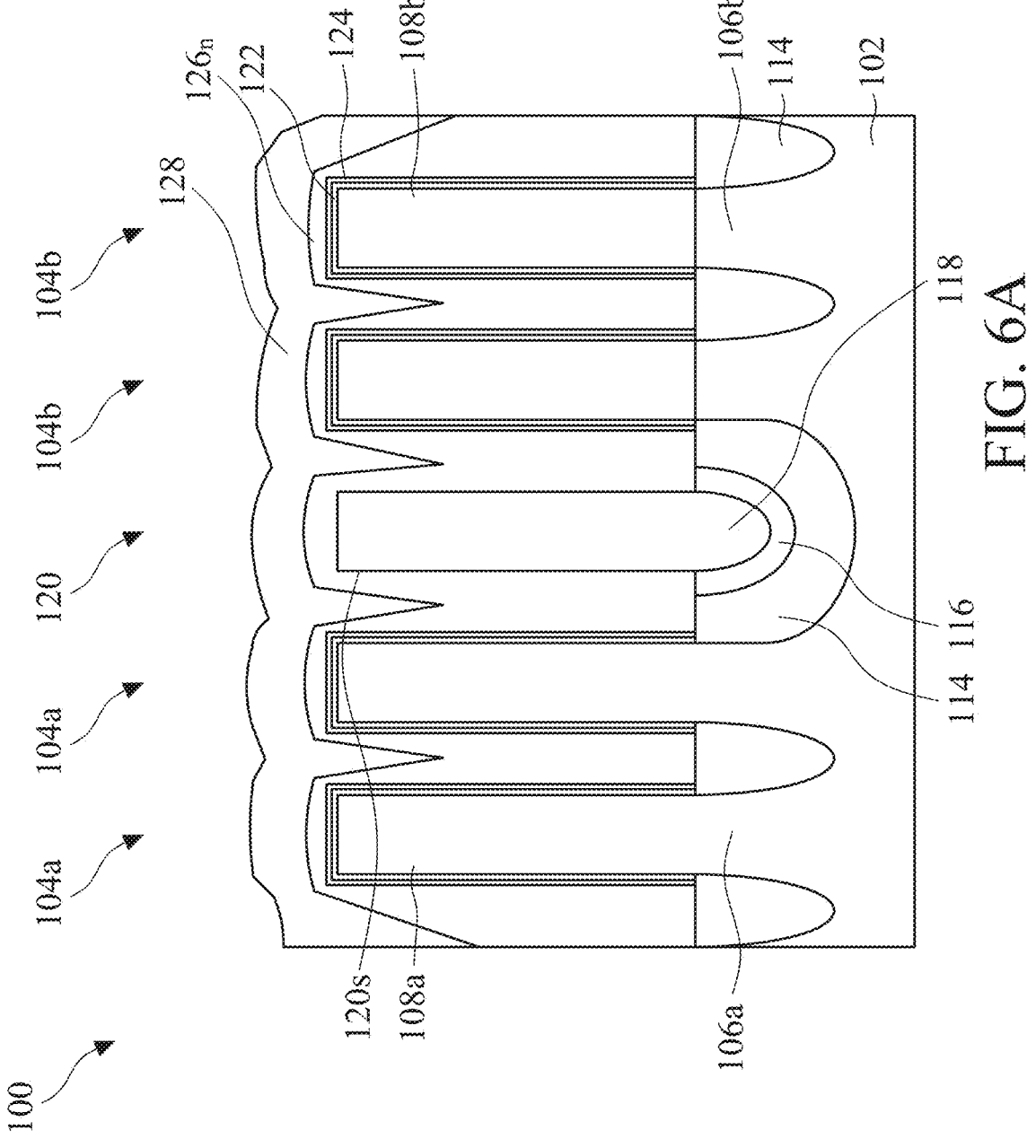

In operation 212, a first silicon cap layer 128 is deposited over the silicon layer 126, as shown in FIG. 6A. FIG. 6A is a schematic cross-sectional view of the semiconductor device 100. The first silicon cap layer 128 may be formed by a blanket deposition to fill remaining regions in the trenches 110, 112. In some embodiments, the first silicon cap layer 128 may have a thickness in a range between about 5 nm and about 20 nm, for example about 10 nm.

In some embodiments, the first silicon cap layer 128 may be deposited using a silicon-containing precursor such as disilane ($Si_2H_6$), monosilane ($SiH_4$), or the mixture of disilane and monosilane. Depending on the temperature and other process conditions, the first silicon cap layer 128 may be an amorphous silicon layer or a crystalline silicon layer. In some embodiments, the temperature for growing the first silicon cap layer 128 may be selected to generate desirable crystalline structure.

In some embodiments, the first silicon cap layer 128 is an amorphous silicon layer to reduce the outward bending of the fin structures 104. For example, the first silicon cap layer 128 may be deposited using monosilane as precursor at a temperature in the range between about 450° C. and about 500° C.

Figure 6B:
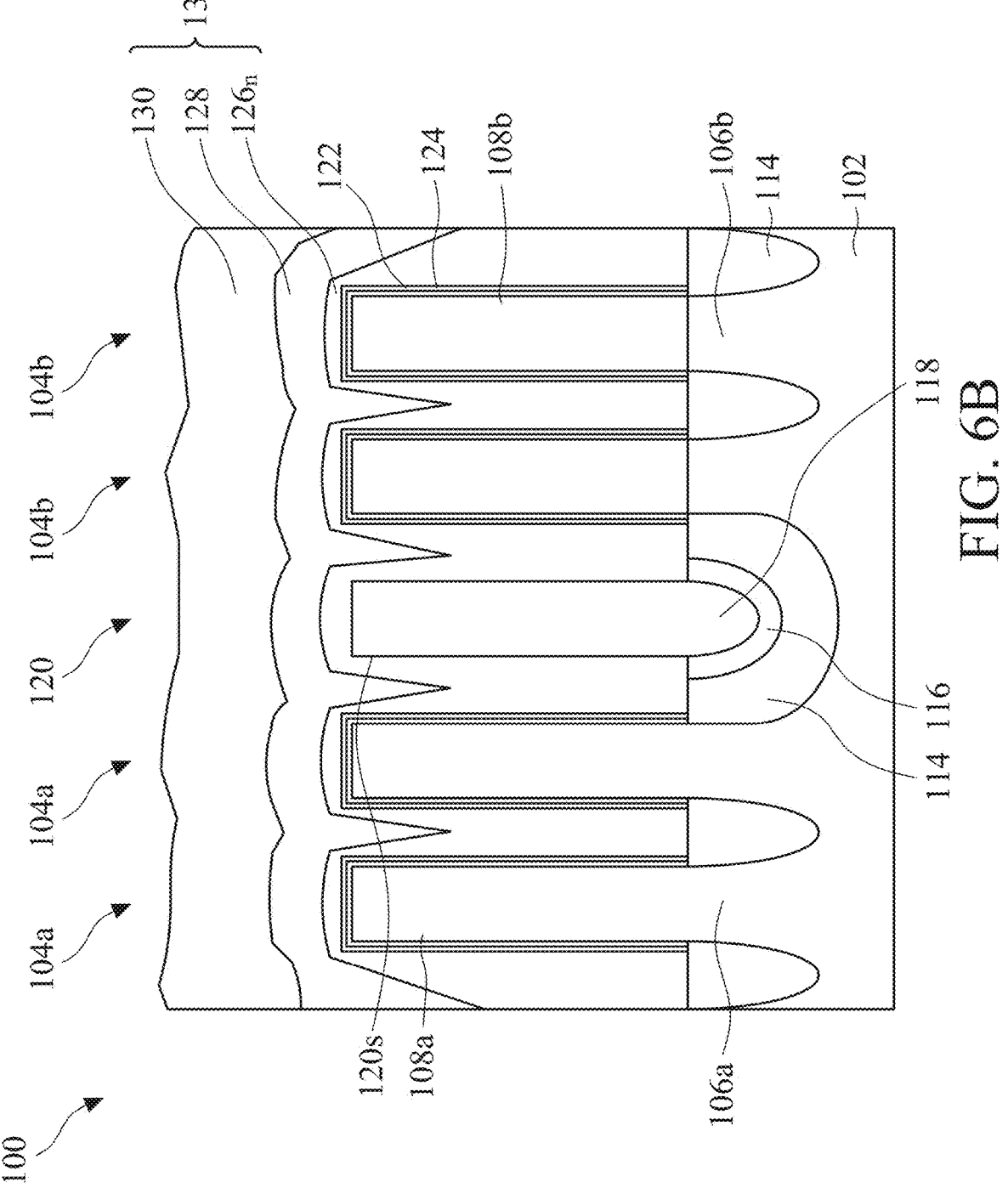

In operation 214, a second silicon cap layer 130 is deposited over the first silicon cap layer 128, as shown in FIG. 6B. FIG. 6B is a schematic cross-sectional view of the semiconductor device 100. The second silicon cap layer 130 may be formed by a blanket deposition to reach a target thickness for a sacrificial gate electrode to be formed. In some embodiments, the second silicon cap layer 130 may have a thickness in a range between about 150 nm and about 250 nm, for example about 185 nm. In some embodiments, the second silicon cap layer 130 may be deposited using a silicon-containing precursor such as disilane ($Si_2H_6$), monosilane ($SiH_4$), or the mixture of disilane and monosilane. Depending on the temperature and other process conditions, the second silicon cap layer 130 may be an amorphous silicon layer or a crystalline silicon layer. In some embodiments, the temperature for growing the second silicon cap layer 130 may be selected to generate desirable crystalline structure.

In some embodiments, the second silicon cap layer 130 is a crystalline silicon layer, such as a polycrystalline silicon layer. The crystalline structure in the second silicon cap layer 130 may interact with the first silicon cap layer 128 to remove any seams formed with the trenches 110 and 112. In some embodiments, the second silicon cap layer 130 may be deposited using monosilane as precursor at a temperature greater than 500° C., for example in the range between about 500° C. and about 700° C.

In some embodiments, the first and second silicon cap layers 128, 130 may be deposited in the same processing chamber. For example, upon depositing the first silicon cap layer 128 to a target thickness, processing conditions are changed, for example increasing the processing temperature to greater than 500° C., to deposit the second silicon cap layer 130.

As shown in FIG. 6B, the first and silicon cap layers 128, 130 according to the present disclosure have different crystalline structures. The different crystalline structure arrangement in the cap layers enables a void free sacrificial gate electrode layer deposition in high aspect ratio trenches.

Figure 6C:
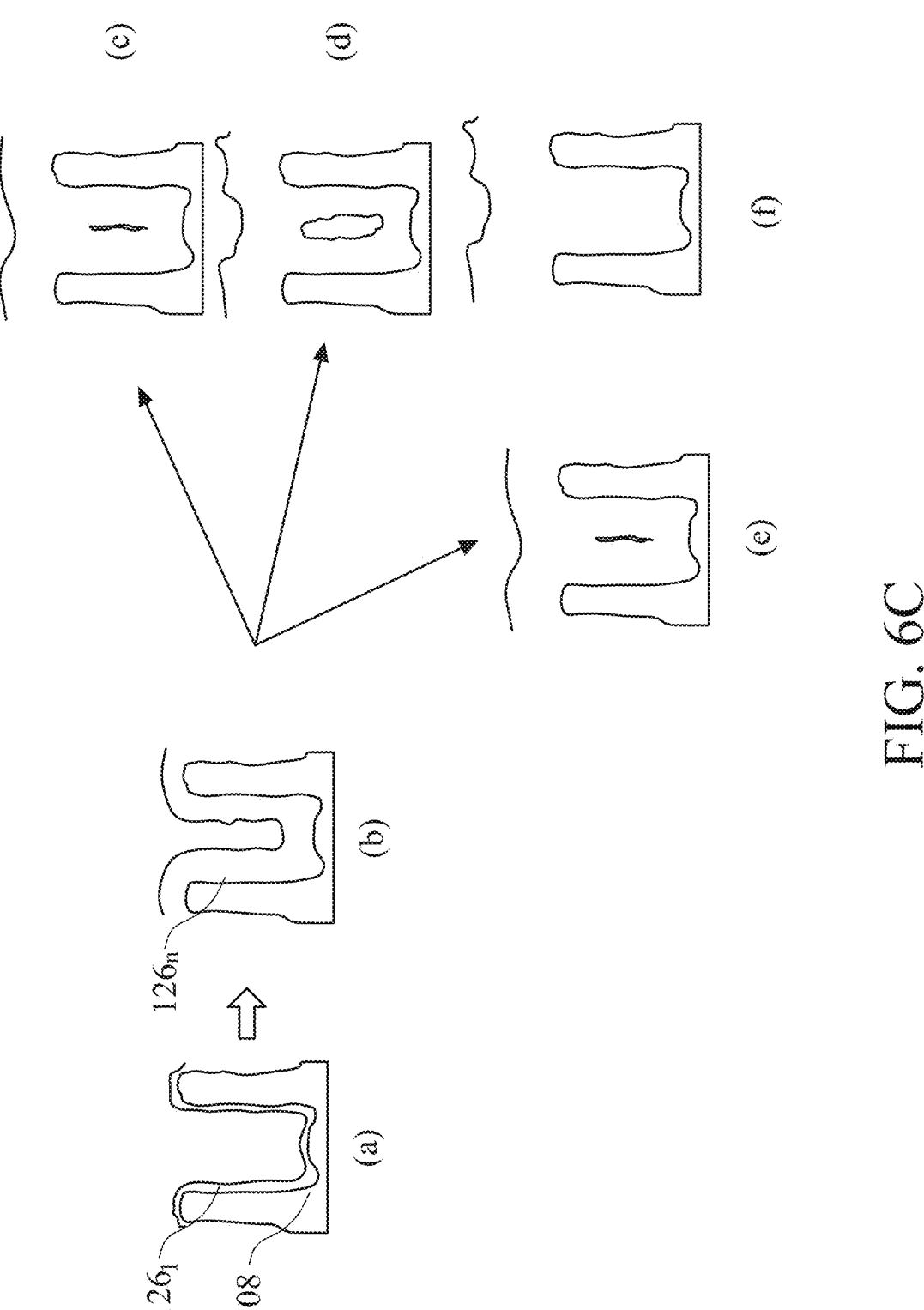

FIG. 6C includes a cartoon illustration of gap filling results using cap layers of different crystalline structures. In FIG. 6C, graphs (a) and (b) schematically illustrate a bottom-up deposition in a trench between two semiconductor fins. The bottom-up filling may be performed using operation 210 according to the present disclosure. The bottom-up deposition results in an amorphous silicon in the trench, as shown in graph (b). Graph (c) demonstrates that a seam is formed in the trench if a silicon cap layer with amorphous silicon is deposited after the bottom-up deposition in graph (b). Graph (d) demonstrates that a void is formed in the trench if a silicon cap layer with crystalline silicon is deposited after the bottom-up deposition in graph (b). The void may be caused by the outward fin bending effect of the crystalline silicon layer. Graphs (e) and (f) demonstrate that void free and seam free silicon is formed in the trench when a hetero-crystalline cap layer is deposited after the bottom-up deposition in graph (b). Particularly, a cap layer including an amorphous sublayer and a crystalline sublayer may be deposited to improve gap filling.

Figure 7A:
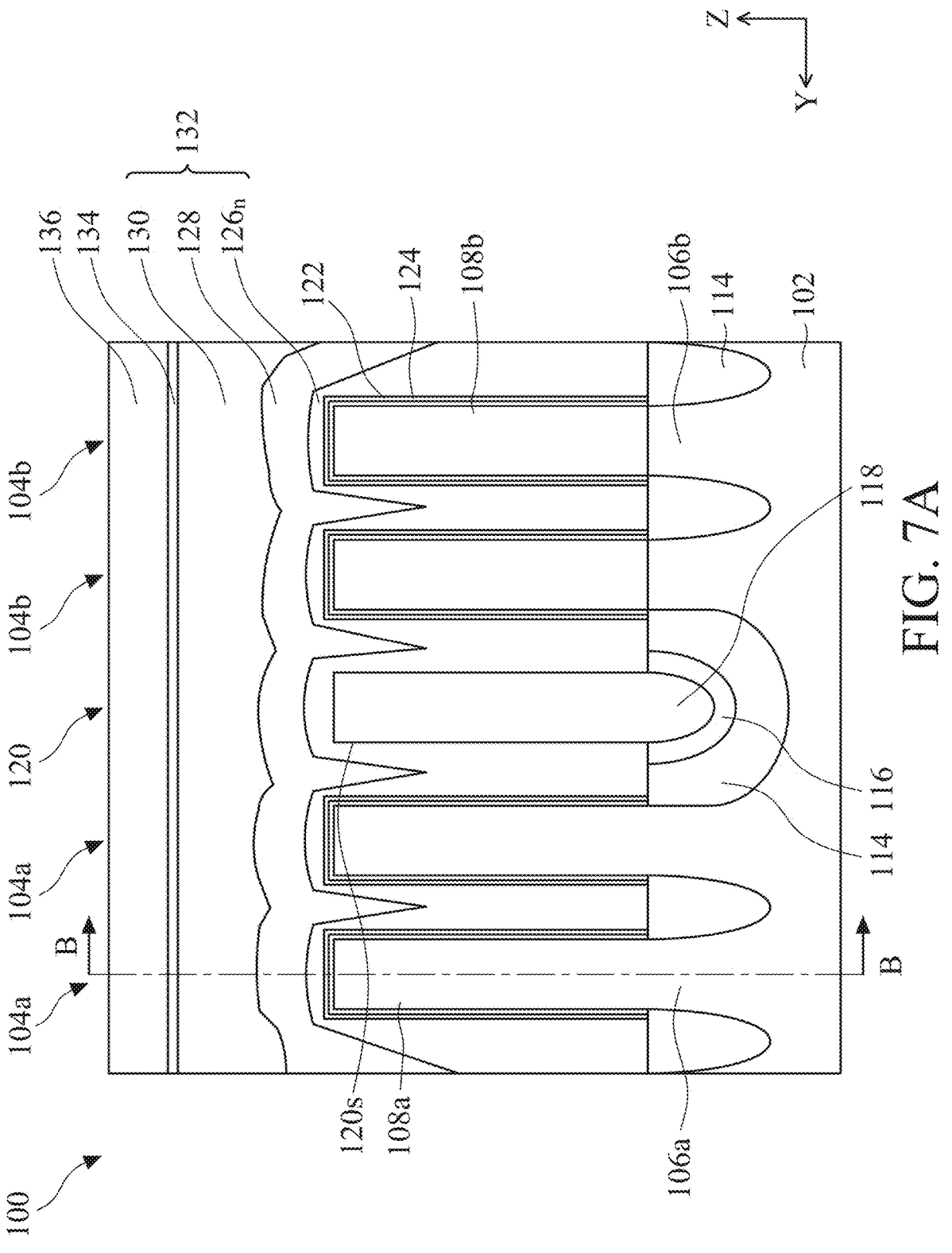

In operation 216, sacrificial gate structures 138 are formed as shown in FIGS. 7A and 7B. FIG. 7A is a cross sectional view of the semiconductor device 100 along the line A-A in FIG. 7B. FIG. 7B is a cross sectional view of the semiconductor device 100 along the line B-B in FIG. 7A.

The seed layer 124, silicon layer 126, first silicon cap layer 128, and second silicon cap layer 130 may be collectively referred to as sacrificial gate electrode layer 132. In some embodiments, after deposition of the second silicon cap layer 130, a planarization process, such as by a CMP process, is performed resulting in the sacrificial gate electrode layer 132 as shown in FIG. 7A. In some embodiments, a pad layer 134, and a mask layer 136 are sequentially deposited over the sacrificial gate electrode layer 132. The pad layer 134 may include silicon nitride. The mask layer 136 may include silicon oxide. A patterning operation is performed on the mask layer 136, the pad layer 134, the sacrificial gate electrode layer 132, and the sacrificial gate dielectric layer 122 to form the sacrificial gate structures 138 using one or more etching processes, such as one or more plasma etching processes or one or more wet etching processes. In some embodiments, the mask layer 136 and pad layer 134 are first patterned using a patterning process. The sacrificial gate electrode layer 132 is then patterned using the patterned mask layer 136 and pad layer 134 as an etching mask. In some embodiments, the sacrificial gate electrode layer 132 may be etched by an anisotropic etching, such as a reactive ion etching (RIE) process. The anisotropic etching has a greater etching rate along the Z direction than etching rates along the X and Y directions. During the etching of the sacrificial gate electrode layer 132, the sacrificial gate dielectric layer 122 on the fin structures 104 may act as an etch stop to prevent the etchant from removing the fin structures 104. The sacrificial gate structure 138 covers portions of the fin structures 104. The portions of the fin structures 104 covered by the sacrificial gate structures 138 eventually form channel regions for FinFET to be formed.

In operation 218, sidewall spacers 140 are formed on the sacrificial gate structure 138, as shown in FIG. 8. FIG. 8 is a schematic cross-sectional view of the semiconductor device 100 along the line A-A of FIG. 7B.

The sidewall spacers 140 may be formed by depositing one or more dielectric layers by ALD or CVD, or any other suitable method. The dielectric layers may include suitable dielectric material, such as silicon oxide, silicon oxynitride, or combinations thereof. The dielectric layers may be formed by blanket deposition sequentially. In some embodiments, an anisotropic etching may be performed to remove the dielectric layers from horizontal surfaces, such that the sidewall spacers 140 are positioned on sidewalls of the sacrificial gate structures 138.

In operation 220, the fin structures 104 in source/drain region, or regions not covered by the sacrificial gate structures 138 and sidewall spacers 140, are recess etched, as shown in FIG. 8. In some embodiments, suitable dry etching and/or wet etching may be used to remove the semiconductor material in the fin structures 104. In some embodiments, the fin structures 104a, 104b are recessed to a level below the isolation layer 114. As shown in FIG. 8, source/drain recesses 142 are formed on both sides of the sacrificial gate structures 138.

In operation 222, epitaxial source/drain regions 144 are formed in the source/drain recesses 142, as shown in FIG. 9. FIG. 9 is a schematic cross-sectional view of the semiconductor device 100 along the line A-A of FIG. 7B. The epitaxial source/drain regions 144 may be formed by any suitable method, such as by CVD, CVD epitaxy, molecular beam epitaxy (MBE), or any suitable deposition technique. The epitaxial source/drain regions 144 may include one or more layers of Si, SiP, SiC and SiCP for n-type device or Si, SiGe, Ge for p-type devices. For n-type devices, the epitaxial source/drain regions 144 also include n-type dopants, such as phosphorus (P), arsenic (As), etc. For p-type devices, the epitaxial source/drain regions 144 include p-type dopants, such as boron (B).

The epitaxial source/drain regions 144 may be grown in an epitaxial chamber by a suitable process. For example, the epitaxial source/drain regions 144 are formed by a selective etching growth process, in which a thin film is deposited by introducing a reactant gas including deposition agent and etchant together. In some embodiments, an optional etching process may be performed to achieve desired shape and/or thickness of the epitaxial layer being formed.

Figure 10:
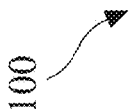

At operation 224, a contact etch stop layer (CESL) 146 and an interlayer dielectric (ILD) layer 148 are formed over the semiconductor device 100, as shown in FIG. 10. FIG. 10 is a schematic cross-sectional view of the semiconductor device 100 along the line A-A of FIG. 7B. The CESL 146 is conformally formed over exposed surfaces of the semiconductor device 100. The CESL 146 is formed on the epitaxial source/drain regions 144, the sidewall spacers 140, and the isolation layer 114 if exposed. The CESL 146 may include SiN, SiON, SiCN or any other suitable material, and may be formed by CVD, PVD, or ALD.

The interlayer dielectric (ILD) layer 148 is formed over the CESL 146. The materials for the ILD layer 148 include compounds comprising Si, O, C, and/or H, such as silicon oxide, SiCOH and SiOC. Organic materials, such as polymers, may be used for the ILD layer 148. In some embodiments, the ILD layer 148 may be formed by flowable CVD (FCVD). The ILD layer 148 protects the epitaxial source/drain regions 144 during the removal of the sacrificial gate structures 138.

Figure 11A:
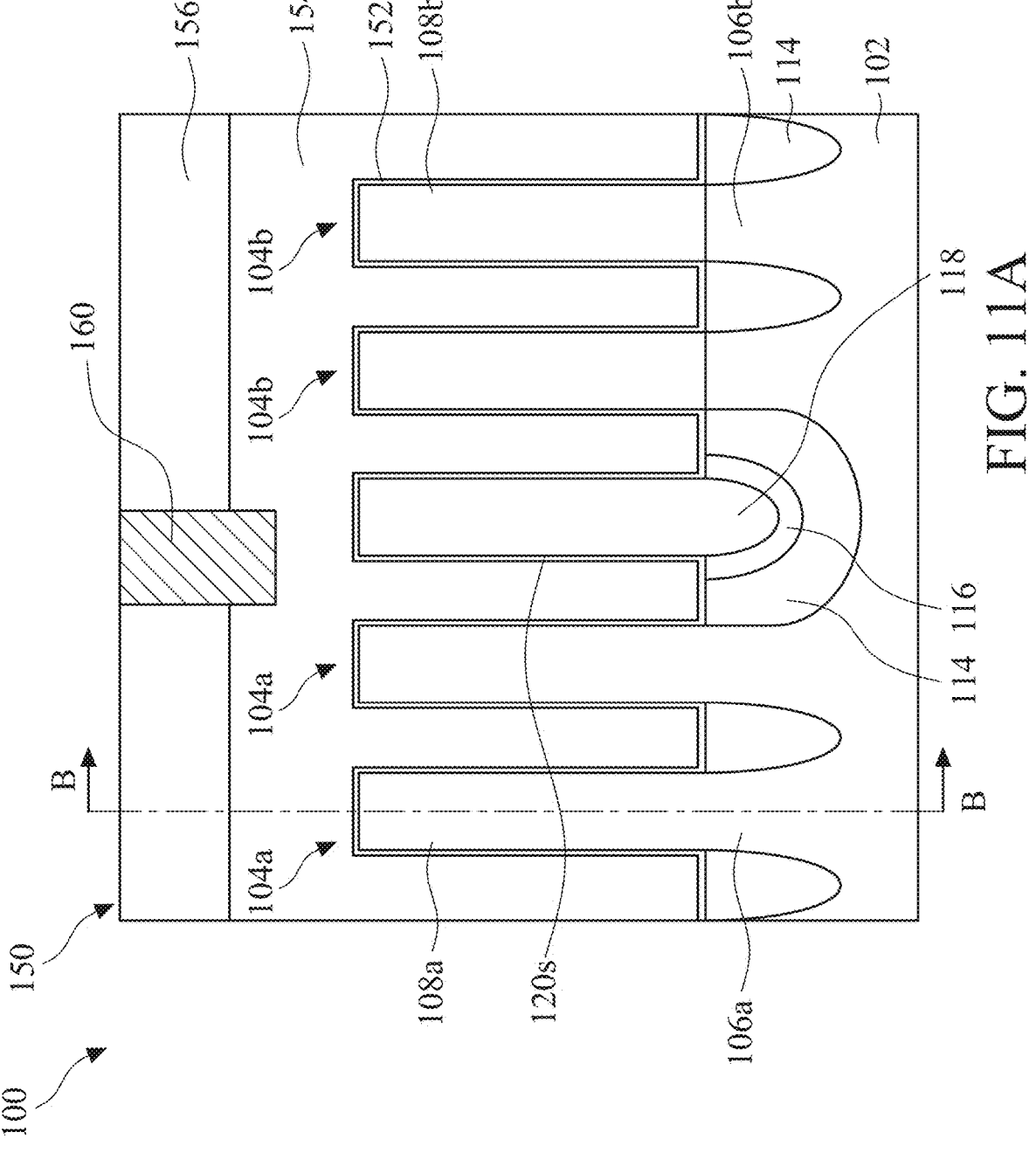
Figure 11B:

At operation 226, replacement gate structures 150 are formed, as shown in FIGS. 11A and 11B. FIG. 11A is a cross sectional view of the semiconductor device 100 along the line A-A in FIG. 11B. FIG. 11B is a cross sectional view of the semiconductor device 100 along the line B-B in FIG. 11A. The sacrificial gate dielectric layer 122 and sacrificial gate electrode layer 132 are removed by one or more suitable process, such as dry etch, wet etch, or a combination thereof, to expose the fin structures 104. In some embodiments, a wet etchant such as a tetramethylammonium hydroxide (TMAH) solution is used. The replacement gate structure 150 may include a gate dielectric layer 152, and a gate electrode layer 154. Optionally, the replacement gate structure may include a self-aligned contact (SAC) layer 156.

The gate dielectric layer 152 may be conformally deposited on exposed surfaces in the gate cavities. The gate dielectric layer 152 may have different composition and dimensions for N-type devices and P-type devices and are formed separately using patterned mask layers and different deposition recipes. The gate dielectric layer 152 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 152 may be formed by CVD, ALD or any suitable method.

The gate electrode layer 154 is then formed on the gate dielectric layer 152 to fill the gate cavities. The gate electrode layer 154 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 154 may be formed by CVD, ALD, electro-plating, or other suitable method. After the formation of the gate electrode layer 154, a planarization process, such as a CMP process, is performed to remove excess deposition of the gate electrode material and expose the top surface of the ILD layer 148.

In some embodiments, a metal gate etching back (MGEB) process is performed to form the self-aligned contact (SAC) layer 156. One or more etching processes are performed to remove portions of the gate dielectric layer 152 and the gate electrode layer 154 to form trenches in the region above the remaining gate electrode layer 154. The MGEB process may be a plasma etching process employing one or more etchants such as chlorine-containing gas, a bromine-containing gas, and/or a fluorine-containing gas. The etching process allows the gate dielectric layer 152 and the gate electrode layer 154 to be selectively etched from the ILD layer 148 and the CESL 146.

After filling the trenches with the SAC layer 156, a planarization process, such as a CMP process, is performed to remove excess deposition of the SAC layer 156 to expose the top surface of the ILD layer 148. Source/drain contact features 158 and gate contact features 160 are formed as shown in FIGS. 11A and 11B.

Referring to FIG. 11A, profiles of the fin structures 104 in the replacement gate structure 150 may reflect the profiles shown in FIG. 5F. For example, the fin structures 104 may bend outward from each other and toward the neighboring dielectric fin 120.

Various embodiments or examples described herein offer multiple advantages over the state-of-art technology. Embodiments of the present disclosure provide a method for selectively forming a seed layer over semiconductor fins, therefore, reducing aspect ratio increase and improving gap-fill quality. By forming the selective seed layer using a mono-silane at an increased temperature, embodiments of the present disclosure also improves abruptness of germanium, preventing germanium in the channel region from diffusion and oxidation, and eventually improve trap density in the channel region. By depositing a hetero-crystalline silicon cap layer over the bottom-up gap layer during formation of sacrificial gate electrode, embodiments of the present disclosure further improve gap filling. The hetero-crystalline silicon cap layer may also tune profiles of the semiconductor fin structures.

It will be understood that not all advantages have been necessarily discussed herein, no particular advantage is required for all embodiments or examples, and other embodiments or examples may offer different advantages.

Some embodiments of the present disclosure relate to a method for manufacturing a semiconductor device, comprising: forming a first semiconductor fin structure and a second semiconductor fin structure; forming a dielectric fin structure between the first and second semiconductor fin structures; selectively forming a seed layer on the first and second semiconductor fin structures, wherein sidewalls of the dielectric fin structure remain exposed after formation of the seed layer; depositing a sacrificial gate electrode layer over the seed layer and the dielectric fin structure; forming a sacrificial gate structure from the sacrificial gate electrode layer; forming sidewall spacers on the sacrificial gate structure; etching the first and second semiconductor fin structures; forming epitaxial source/drain regions; removing the sacrificial gate structure; and forming a replacement gate structure between the sidewall spacers.

Some embodiments of the present disclosure relate to a method for manufacturing a semiconductor device, comprising: forming a first semiconductor fin structure and a second semiconductor fin structures, wherein a first trench is formed between the first and second semiconductor fin structure; forming a first silicon layer over the first and second semiconductor fin structures, wherein the first silicon layer is disposed in the first trench in a bottom-up manner; depositing a first cap layer over the first silicon layer; depositing a second cap layer over the first cap layer, wherein the first and second cap layers have different crystalline structures; etching the first silicon layer, the first cap layer, and the second cap layer to form a sacrificial gate structure; forming sidewall spacers on the sacrificial gate structure; etching the first and second semiconductor fin structures; forming epitaxial source/drain regions; removing the sacrificial gate structure; and forming a replacement gate structure between the sidewall spacers.

Some embodiments of the present disclosure relate to a method for manufacturing a semiconductor device, comprising: forming two first fin structures, wherein a first trench is formed between the two first fin structures; forming two second fin structures, wherein a second trench is formed between the two first fin structures; forming a dielectric fin structure, wherein the dielectric fin structure is disposed between the first fin structures and the second fin structures, a third trench is formed between the dielectric fin structure and the first fin structure, and the third trench is narrower than the first and second trenches; selectively forming a seed layer on the first and second fin structures, wherein sidewalls of the dielectric fin structure remain exposed after formation of the seed layer; and forming a gap-fill silicon layer in the first, second, and third trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for manufacturing a semiconductor device, comprising:
   forming a first semiconductor fin structure and a second semiconductor fin structure;
   forming a dielectric fin structure between the first and second semiconductor fin structures;
   selectively forming a seed layer on the first and second semiconductor fin structures, wherein sidewalls of the dielectric fin structure remain exposed after formation of the seed layer;
   depositing a sacrificial gate electrode layer over the seed layer and the dielectric fin structure;
   forming a sacrificial gate structure from the sacrificial gate electrode layer;
   forming sidewall spacers on the sacrificial gate structure;
   etching the first and second semiconductor fin structures;
   forming epitaxial source/drain regions;
   removing the sacrificial gate structure; and
   forming a replacement gate structure between the sidewall spacers.

2. The method of claim 1, wherein selectively forming the seed layer comprises:
   depositing a silicon layer over the first and second semiconductor fin structures and the dielectric fin structure, wherein the silicon layer has a first growth rate on the first and second semiconductor fin structures and a second growth rate on the dielectric fin structure, and the first growth rate is different from the second growth rate.

3. The method of claim 2, wherein the sidewalls of the dielectric fin structure comprise SiCN.

4. The method of claim 3, wherein depositing the silicon layer comprises flowing a precursor comprises monosilane at a temperature between about 460° C. and about 480° C.

5. The method of claim 2, further comprising:
   etching the silicon layer.

6. The method of claim 5, further comprising:
   performing a surface treatment after etching.

7. The method of claim 1, wherein forming the sacrificial gate electrode layer over the seed layer and the dielectric fin structure comprises:

depositing a first silicon layer using a bottom-up deposition; and depositing a cap layer over the first silicon layer.

8. The method of claim 7, wherein depositing the cap layer comprises:

depositing a first sublayer over the first silicon layer, wherein the first sublayer has a first crystalline structure; and depositing a second sublayer over the first sublayer, wherein the second sublayer has a second crystalline structure different from the first crystalline structure.

9. The method of claim 8, wherein the first sublayer is an amorphous silicon layer and the second sublayer is a crystalline silicon layer.

10. A method for manufacturing a semiconductor device, comprising:

forming a first semiconductor fin structure and a second semiconductor fin structures, wherein a first trench is formed between the first and second semiconductor fin structure;

forming a first silicon layer over the first and second semiconductor fin structures, wherein the first silicon layer is disposed in the first trench in a bottom-up manner;

depositing a first cap layer over the first silicon layer;

depositing a second cap layer over the first cap layer, wherein the first and second cap layers have different crystalline structures;

etching the first silicon layer, the first cap layer, and the second cap layer to form a sacrificial gate structure;

forming sidewall spacers on the sacrificial gate structure;

etching the first and second semiconductor fin structures;

forming epitaxial source/drain regions;

removing the sacrificial gate structure; and forming a replacement gate structure between the sidewall spacers.

11. The method of claim 10, wherein the first cap layer is an amorphous silicon layer and the second cap layer is a crystalline silicon layer.

12. The method of claim 10, further comprising depositing a seed layer over the first and second semiconductor fin structures prior to forming the first silicon layer.

13. The method of claim 12, wherein the first and second semiconductor fin structures comprises germanium, and depositing the seed layer comprises depositing a silicon layer using a precursor comprising monosilane at a temperature range between about 460° C. and about 480° C.

14. The method of claim 12, further comprising forming a dielectric fin structure adjacent the first semiconductor fin structure, wherein a second trench is formed between the first semiconductor fin structure and the dielectric fin structure, and the seed layer is selectively formed on the first and second semiconductor fin structures.

15. The method of claim 10, wherein depositing the first cap layer comprises applying a first precursor at a first temperature, depositing the second cap layer comprises applying the first precursor at a second temperature, and the second temperature is higher than the first temperature.

16. A method for manufacturing a semiconductor device, comprising:

forming two first fin structures, wherein a first trench is formed between the two first fin structures;

forming two second fin structures, wherein a second trench is formed between the two first fin structures;

forming a dielectric fin structure, wherein the dielectric fin structure is disposed between the first fin structures and the second fin structures, a third trench is formed between the dielectric fin structure and the first fin structure, and the third trench is narrower than the first and second trenches;

selectively forming a seed layer on the first and second fin structures, wherein sidewalls of the dielectric fin structure remain exposed after formation of the seed layer; and forming a gap-fill silicon layer in the first, second, and third trenches.

17. The method of claim 16, wherein selectively forming the seed layer comprises:

depositing a silicon layer, wherein the silicon layer has a first growth rate on the first and second fin structures and a second growth rate on the dielectric fin structure, and the first growth rate is greater than the second growth rate; and etching back the silicon layer to remove deposition from the dielectric fin structure.

18. The method of claim 17, wherein selectively forming the seed layer further comprises performing a surface treatment.

19. The method of claim 16, further comprising depositing a hetero-crystalline cap layer over the gap-fill silicon layer.

20. The method of claim 16, wherein forming the gap-fill silicon layer comprises cyclically performing a depositing process, an anneal process, and an etch process.

* * * * *